United States Patent
Tamai et al.

(10) Patent No.: US 7,894,239 B2
(45) Date of Patent: Feb. 22, 2011

(54) VARIABLE RESISTANCE ELEMENT, METHOD FOR PRODUCING THE SAME, AND NONVOLATILE SEMICONDUCTOR STORAGE DEVICE

(75) Inventors: Yukio Tamai, Tsuchiura (JP); Yasunari Hosoi, Fukuyama (JP); Nobuyoshi Awaya, Fukuyama (JP); Shigeo Ohnishi, Fukuyama (JP); Kazuya Ishihara, Kurashiki (JP); Hisashi Shima, Tsukuba (JP); Fumiyoshi Takano, Tsukuba (JP); Hiroyuki Akinaga, Tsukuba (JP)

(73) Assignees: Sharp Kabushiki Kaisha, Osaka-Shi (JP); National Institute of Advanced Industrial Science and Technology, Tokyo (JP)

( * ) Notice: Subject to any disclaimer, the term of this patent is extended or adjusted under 35 U.S.C. 154(b) by 159 days.

(21) Appl. No.: 12/328,648

(22) Filed: Dec. 4, 2008

(65) Prior Publication Data

US 2009/0147558 A1  Jun. 11, 2009

(30) Foreign Application Priority Data

Dec. 7, 2007  (JP) .............................. 2007-317733

(51) Int. Cl.
*G11C 7/00* (2006.01)
(52) U.S. Cl. ...................................... 365/148; 365/158
(58) Field of Classification Search ................. 365/148, 365/158

See application file for complete search history.

(56) References Cited

U.S. PATENT DOCUMENTS

| 6,204,139 | B1 | 3/2001 | Liu et al. |
| 7,384,792 | B1 | 6/2008 | Wang et al. |
| 2004/0175859 | A1* | 9/2004 | Campbell et al. ........... 438/102 |
| 2004/0245557 | A1 | 12/2004 | Seo et al. |
| 2004/0264244 | A1 | 12/2004 | Morimoto |
| 2005/0206892 | A1 | 9/2005 | Wang et al. |
| 2005/0219769 | A1* | 10/2005 | Shimura et al. ........... 360/324.2 |

(Continued)

FOREIGN PATENT DOCUMENTS

JP  2004-363604 A  12/2004

(Continued)

OTHER PUBLICATIONS

Liu et al., Applied Physics Letters, vol. 76, No. 19, pp. 2749-2751, 2000.

(Continued)

*Primary Examiner*—Michael T Tran
(74) *Attorney, Agent, or Firm*—Birch, Stewart, Kolasch & Birch, LLP

(57) ABSTRACT

The variable resistance element of the present invention is a variable resistance element having an electrode, the other electrode, and a metal oxide material sandwiched between the electrodes and having an electrical resistance, between the electrodes, changing reversibly in response to a voltage applied between the electrodes. The variable resistance element further includes, inside the metal oxide material, a low resistance material having a lower electrical resistance than the metal oxide material and being out of contact with at least either one of the electrodes. This makes it possible to reduce a forming voltage for providing a conductive section inside the metal oxide material, without causing a leakage current to increase.

13 Claims, 13 Drawing Sheets

U.S. PATENT DOCUMENTS

| | | |
|---|---|---|
| 2006/0056114 A1* | 3/2006 | Fukumoto et al. ........ 360/324.2 |
| 2006/0098472 A1* | 5/2006 | Ahn et al. .................... 365/145 |
| 2007/0045692 A1 | 3/2007 | Kim et al. |
| 2007/0090444 A1 | 4/2007 | Park et al. |
| 2007/0114587 A1 | 5/2007 | Seo et al. |
| 2007/0140900 A1 | 6/2007 | Wang et al. |
| 2007/0153267 A1 | 7/2007 | Wang et al. |
| 2007/0153269 A1 | 7/2007 | Wang et al. |
| 2007/0159869 A1 | 7/2007 | Baek et al. |
| 2007/0229817 A1 | 10/2007 | Wang et al. |
| 2009/0117697 A1 | 5/2009 | Park et al. |

FOREIGN PATENT DOCUMENTS

| | | |
|---|---|---|
| JP | 2005-25914 | 1/2005 |
| JP | 2007-116166 | 5/2007 |
| JP | 2007-180174 | 7/2007 |
| JP | 2007-184613 | 7/2007 |
| JP | 2007-288016 | 11/2007 |
| KR | 100647333 B1 | 11/2006 |
| KR | 1020070043444 A | 4/2007 |

OTHER PUBLICATIONS

Baek et al., IEDM Technical Digest, pp. 587-590, 2004.

* cited by examiner

WITHOUT HEAT TREATMENT

HEAT TREATMENT 300°C 10min

VARIABLE RESISTANCE ELEMENT, METHOD FOR PRODUCING THE SAME, AND NONVOLATILE SEMICONDUCTOR STORAGE DEVICE

This Nonprovisional application claims priority under 35 U.S.C. §119(a) on Patent Application No. 317733/2007 filed in Japan on Dec. 7, 2007, the entire contents of which are hereby incorporated by reference.

FIELD OF THE INVENTION

The present invention relates to a variable resistance element having an electrical resistance which reversibly changes in response to a change in voltage applied to a metal oxide material sandwiched between two electrodes, a method for producing the variable resistance element, and a nonvolatile semiconductor storage device having the variable resistance element served as a memory cell.

BACKGROUND OF THE INVENTION

Recently, a nonvolatile semiconductor storage device represented by a flash memory has been remarkably developed in capacity. These days, a product having approximately 4 gigabyte capacity is marketed for about several tens of thousands yen. In particular, a mobile or transportable memory such as a USB memory is increasing in commercial value, and its market is growing rapidly so as to take the place of magnetic optical disc and the like.

Moreover, several-gigabyte capacity is large enough for a storage for mobile music player. Apart from a hard disk-mounted mobile music player, which is rapidly spreading, users are attracted to a mobile music player including a nonvolatile semiconductor storage device, which is a solid-state device. This is because such a mobile music player has advantages based on principle of a solid-state memory, such as vibration resistance, high reliability, and low power consumption. Such a nonvolatile semiconductor storage device is expected to become a majority of storages for mobile or transportable products intended for music and image.

Further work on the nonvolatile semiconductor storage device is proceeding for the purpose of realizing a further development in capacity and reduction in bit-cost in view of future possibilities of being a storage for a mobile or transportable product which records/reproduces a moving image.

In particular, with maintenance of advantages of the flash memory, such as low cost and small cell area (not more than $4F^2$: F indicates the minimum dimension in producing processes), the nonvolatile semiconductor storage device is required to overcome the following problems attributed to operation principle of the flash memory: (i) large writing/erasing voltage (a pressor circuit is required); (ii) slow writing/erasing operation (in particular, erasing requires more than 100 microseconds); and (iii) limited number of rewriting (less than $10^6$ times). Overcoming the problems enables the nonvolatile semiconductor storage device to substitute for DRAM, which is used as a main memory in a current information equipment. By this, it becomes possible to realize a so-called "instant-on computer" that starts instantly at the point of use, and achieves next to zero standby power consumption.

As one possibility of such a nonvolatile semiconductor storage device for the next generation, a nonvolatile memory element such as a ferroelectric memory (FeRAM) and a magnetic memory (MRAM), each of which adopts its unique principle, has been studied and developed. However, it is difficult for these elements to be superior to the flash memory in terms of low bit-cost and small cell area.

Under such a circumstance, a phase-change memory (PRAM), a resistance random access memory (RRAM®), and the like are drawing attention as a memory that could be superior in bit-cost to the flash memory. The resistance random access memory herein has, as a data storage section, a variable resistance element including two electrodes and a metal oxide material sandwiched between the two electrodes. It is possible to change an electrical resistance of the variable resistance element by applying, to the two electrodes of the variable resistance element, a voltage (or electric current) that is higher than the threshold voltage (or threshold electric current). Even after once stopping the application of the voltage (or electric current), the resistance state can be maintained in a nonvolatile manner. This enables the resistance random access memory to make data correspond to different resistance states of the variable resistance element so that the data can be stored.

For example, U.S. Pat. No. 6,204,139 (publication date: Mar. 20, 2001; hereinafter referred to as "Patent Document 1") and "Electric-pulse-induced reversible Resistance change effect in magnetoresistive films" Applied Physics Letter, Vol. 76, pp. 2749-2751, 2000 (hereinafter referred to as "Non-Patent Document 1") disclose "a method for changing a resistance value by applying electrical pulses having different polarities to thin film made from a perovskite material, which film is sandwiched between a pair of electrodes". However, the perovskite material has a problem in compatibility with a general semiconductor process.

In order to solve this problem, Japanese Unexamined Patent Publication No. 2004-363604 (Tokukai 2004-363604; publication date: Dec. 24, 2004; hereinafter referred to as "Patent Document 2") discloses a resistance random access memory including a binary oxide that has a simple composition and a high compatibility with the semiconductor process. Specifically, Patent Document 2 discloses "a nonvolatile memory device having a data storing material layer that exhibits different resistance characteristics for different voltages, wherein a transition metal oxide film having a resistance which rapidly becomes high in response to a voltage within a certain range is NiO, $V_2O_5$, ZnO, $Nb_2O_5$, $TiO_2$, $WO_3$, or CoO".

Further, "Highly Scalable Non-volatile Resistive Memory using Simple Binary Oxide Driven by Asymmetric Unipolar Voltage Pulses" IEDM Technical Digest, pp. 587-590, 2004 (hereinafter referred to as "Non-Patent Document 2") describes a nonvolatile resistance random access memory element having an upper and lower electrodes and NiO, $TiO_2$, $ZrO_2$, or $HfO_2$, which is a binary transition metal oxide material sandwiched between the two electrodes.

As described above, the resistance random access memory including the binary transition metal oxide material, which is described in Patent Document 2 or Non-Patent Document 2, has a simple structure/composition and a high compatibility with the semiconductor process, thereby having an advantage of being easily applied to a highly-integrated nonvolatile memory.

However, in the resistance random access memory including the binary transition metal oxide material, which is described in Patent Document 2 or Non-Patent Document 2, a variable resistance element constituting this memory needs to be subjected to such an initializing process called "forming" that causes a soft breakdown. Specifically, the forming intends forming a conductive path, inside the metal oxide material, for electrically connecting two electrodes by generating an electric potential difference of a certain degree between the two electrodes. In case the variable resistance element is applied to a highly-integrated nonvolatile memory, it is extremely important to lower a voltage for the forming (hereinafter referred to as "forming voltage") in the light of simplification of peripheral circuits.

In this regard, it has been known that the forming voltage is substantially proportional to a film thickness of the metal oxide material sandwiched between the electrodes. It is considered that the forming voltage can be lowered by reducing the film thickness. However, when the film thickness is reduced to such an extent that the forming voltage becomes several volts or less, there arises a problem that a leakage current caused by the reduction in the film thickness increases.

SUMMARY OF THE INVENTION

The present invention has been accomplished in view of the problem above, and an object of the present invention is to provide a variable resistant element in which a forming voltage for providing a conductive section inside a metal oxide material can be reduced without causing a leakage current to increase, a method for producing the same, and a nonvolatile storage device having the variable resistance element served as a storage layer.

In order to attain the object, a variable resistance element of the present invention is a variable resistance element comprising: a first electrode; a second electrode; a metal oxide material sandwiched between the first and second electrodes; the variable resistance element having an electrical resistance between the first and second electrodes, the electrical resistance changing reversibly in response to a voltage applied between the first and second electrodes; and a low resistance material inside the metal oxide material, the low resistance material being provided so as to be out of contact with at least either one of the first and second electrodes and having a lower electrical resistance than the metal oxide material.

In order to reversibly change the electrical resistance between the first and second electrodes in response to the voltage applied between the first and second electrodes, in other words, in order to change the electrical resistance so as to be in either a high resistance state or a low resistance state, it is necessary to apply an initializing process called "forming" to the variable resistance element. Specifically, the forming is to form, inside the metal oxide material, a conductive path for electrically connecting the two electrodes, by applying a certain voltage (hereinafter referred to as "forming voltage") between the two electrodes. The forming voltage is proportional to a film thickness of the metal oxide material in which the conductive path is to be formed.

In order to reduce the forming voltage, the variable resistance element of the present invention has, inside the metal oxide material, the low resistance material having a lower electrical resistance than the metal oxide material. By this, the conductive path formed by the forming does not have to connect the first electrode and the second electrode, but only have to connect the low resistance material and the electrode that is out of contact with the low resistance material (at least either one of the first and second electrodes).

That is to say, in case of a variable resistance element not having the low resistance material inside the metal oxide material, such as one produced by a conventional technique, the film thickness of the metal oxide material in which the conductive path is necessary to be formed intends a distance between the first electrode and the second electrode. In case of the variable resistance element of the present invention, the film thickness of the metal oxide material in which the conductive path is necessary to be formed becomes smaller than the distance between the first and second electrodes because of the presence of the low resistance material inside the metal oxide material. As a result, the variable resistance element of the present invention makes it possible to reduce the forming voltage.

Further, with the variable resistance element of the present invention, it is possible to reduce the forming voltage without thinning the metal oxide material itself, which is sandwiched between the first and second electrodes. This allows to suppress an increase in leakage current attributed to the thinning of the metal oxide material.

Therefore, the variable resistance element of the present invention makes it possible to reduce the forming voltage for providing the conductive section inside the metal oxide material, without causing the leakage current to increase.

In order to attain the object, a variable resistance element of the present invention is a variable resistance element comprising: a first electrode; a second electrode; a metal oxide material sandwiched between the first and second electrodes, the variable resistance element having an electrical resistance, between the first and second electrodes, changing reversibly in response to a voltage applied between the first and second electrodes; a first region and a second region between the metal oxide material and at least either one of the first and second electrodes, the first and second regions being provided in this order from the metal oxide material, the first region including oxygen and a first metal element, the second region being adjacent to the first region and including oxygen, the first metal element, and a second metal element, the first metal element being included in the metal oxide material, and the second metal element constituting at least either one of the first and second electrodes; and in the first region, a ratio of the number of atoms of the oxygen to that of atoms of the first metal element is higher than the ratio in the metal oxide material.

With the arrangement, the variable resistance element of the present invention makes it possible to reduce the forming voltage for providing the conductive section inside the metal oxide material, without causing the leakage current to increase.

In order to attain the object, a method for producing the variable resistance element of the present invention is a method for producing a variable resistance element having a first electrode, a second electrode, and a metal oxide material sandwiched between the first and second electrodes, the variable resistance element having an electrical resistance, between the first and second electrodes, changing reversibly in response to a voltage applied between the first and second electrodes, the method comprising: providing, inside the metal oxide material, a low resistance material having an electrical resistance lower than the metal oxide material and being out of contact with at least either one of the first and second electrodes, by diffusing, into the metal oxide material, an element constituting at least either one of the first and second electrodes.

With the arrangement, the method makes it possible to produce the variable resistance element in which the forming voltage for providing the conductive section inside the metal oxide material can be reduced without causing the leakage current to increase.

Further, with the method, it is not necessary to go through a complicated process including the steps for intentionally forming a gap in the metal oxide material and for filling the gap with the low resistance material. Consequently, the variable resistance element can be easily produced at low cost.

The nonvolatile semiconductor storage device in accordance with the present invention is a nonvolatile semiconductor storage device comprising: a memory cell including a variable resistance element, the variable resistance element including: a first electrode; a second electrode; and a metal oxide material sandwiched between the first and second electrodes; the variable resistance element having an electrical resistance, between the first and second electrodes, changing reversibly in response to a voltage applied between the first and second electrodes; and a low resistance material inside the metal oxide material, the low resistance material being provided out of contact with at least either one of the first and second electrodes and having a lower electrical resistance than the metal oxide material; data writing means for writing externally-inputted data on the memory cell by changing the electrical resistance of the variable resistance element by applying, to the first and second electrodes, a voltage depending on the data; and data readout means for reading out the data stored in the memory cell, based on an amount of an electric current passing through the variable resistance element, the data readout means detecting the amount of the electric current by applying a certain voltage to the first and second electrodes.

According to the arrangement, the nonvolatile semiconductor storage device of the present invention has the variable resistance element of the present invention as the memory cell. Therefore, it is possible to reduce the forming voltage for the forming without causing the leakage current to increase. This makes it possible to reduce power consumption at the time of forming. Moreover, since the forming voltage can be reduced, it is unnecessary to arrange an electronic component of a circuit for applying a voltage to the variable resistance element to be highly resistant to pressure. This allows to reduce the cost.

Additional objects, features, and strengths of the present invention will be made clear by the description below. Further, the advantages of the present invention will be evident from the following explanation in reference to the drawings.

DESCRIPTION OF THE EMBODIMENTS

First, a variable resistance element obtained by a conventional technique is described below as a referential example with reference to FIG. 15 in advance of a variable resistance element of the present invention and a method for producing the same.

REFERENTIAL EXAMPLE

Figure 15:
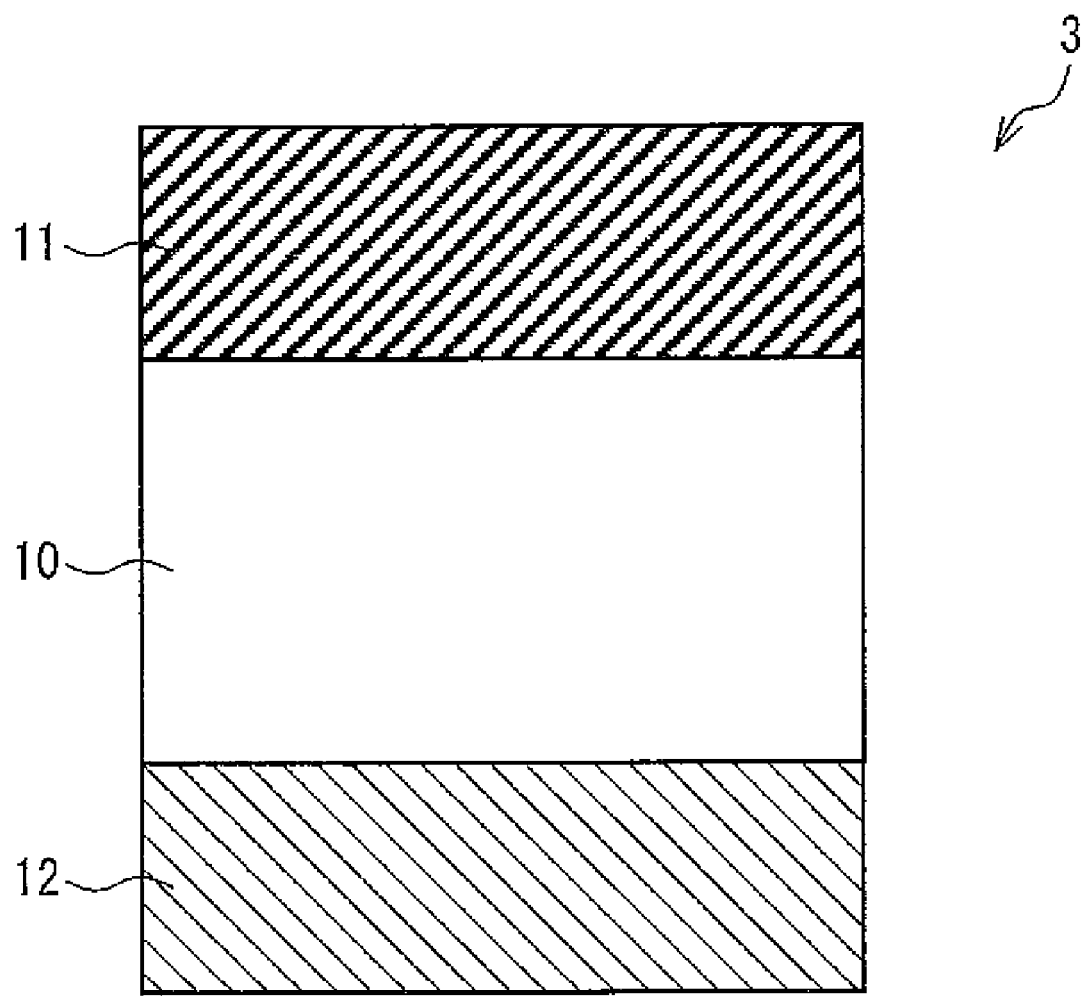
FIG. 15 is a cross-sectional view showing a structure of a conventional variable resistance element.

FIG. 15 is a cross-sectional view showing a structure of a conventional variable resistance element 3 before a forming process. Note that the forming is specifically described later. As shown in FIG. 15, the variable resistance element 3 has electrodes 11 and 12 and a metal oxide layer 10 made of a metal oxide material sandwiched between the electrodes 11 and 12.

Briefly described below is an effect that the variable resistance element 3 achieves. The variable resistance element 3 achieves such an effect that an electrical resistance between the electrodes 11 and 12 changes in response to a threshold voltage applied to the electrodes 11 and 12. Specifically, the electrical resistance between the electrodes 11 and 12 becomes either one of low resistance state and high resistance state in response to the applied threshold voltage.

In the descriptions hereinafter, a low resistance operation by which the electrical resistance between the electrodes 11 and 12 of the variable resistance element 3 is changed from the high resistance state to the low resistance state is referred to as "set operation" for the sake of easy explanation. Likewise, a high resistance operation by which the electrical resistance is changed from the low resistance state to the high resistance state is referred to as "reset operation". Further, the set operation and the reset operation are collectively referred to as "switching operation".

<Forming Process>

In order to make the variable resistance element 3 carry out the switching operation described above, it is necessary to preliminarily carry out, in the variable resistance element 3 shown in FIG. 15, such an initializing process called "forming process" that causes a soft breakdown in the metal oxide layer 10. Specifically, it is necessary to form a filament, which is a local conductive path, inside the metal oxide layer 10 by applying a certain voltage (hereinafter referred to as "forming voltage") between the electrodes 11 and 12.

As described above, the variable resistance element 3 can carry out the switching operation only after the filament is formed inside the metal oxide layer 10 by the forming process. It is considered that the switching operation of the variable resistance element 3 has such a mechanism that the electrical resistance of the variable resistance element 3 is changed into the low resistance state or the high resistance state depending on disconnection/connection of the filament inside the metal oxide layer 10, which is switched in response to the threshold voltage applied to the electrodes 11 and 12.

In this regard, the forming voltage required for carrying out the forming in the variable resistance element 3 is determined depending on a film thickness of the metal oxide layer 10. That is, the thicker the metal oxide layer 10 is, the higher forming voltage needs to be applied. Therefore, it is possible to reduce the forming voltage by thinning the metal oxide layer 10. However, a leakage current increases by thinning the metal oxide layer 10.

<Problems Caused by Leakage Current>

The following describes a problem caused by the increase of the leakage current. The variable resistance element 3 is for use as a memory cell in a nonvolatile storage device. Specifically, the electrical resistance of the variable resistance element 3 is changed into either one of the low resistance state and the high resistance state depending on data to be stored (e.g., bit value). Further, the stored data can be read out by applying a voltage for reading out the data (hereinafter referred to as "readout voltage") to the variable resistance element 3, and then by detecting an electric current corresponding to the low resistance state or the high resistance state. In this regard, only a small part of the metal oxide layer 10, that is, a part where the filament is formed, contributes to a change in the resistance value (hereinafter referred to as "resistance change") between the low resistance state and the high resistance state of the variable resistance element 3. Therefore, the metal oxide material in a region other than the filament part does not have any function. A true ratio of the resistance change (ratio of the resistance value when in the low resistance state to that when in the high resistance state) is determined by the resistance values measured at only the filament part when the filament is electrically connected and disconnected. However, when the readout voltage is applied to the electrodes 11 and 12, an electric current passes through the metal oxide material also in the region other than the filament part. As a result, such an electric current possibly become a majority of electric currents in the high resistance state, thereby decreasing an apparent ratio of the resistance change. That is to say, in the variable resistance element 3 obtained by the conventional technique, a thinner thickness of the metal oxide layer 10 for the purpose of reducing the forming voltage causes an increase in the leakage current. As a result, there arises a problem in that the increased leakage current becomes a majority of the electric currents in the high resistance state, thereby decreasing the ratio of the resistance change in the variable resistance element 3. In a general case of a metal oxide material having a non-linear current-voltage characteristic, if the metal oxide layer 10 is thinned down to a half thickness, for example, an electric current passing when the readout voltage is applied increases more than double.

First Embodiment

A variable resistance element 1 in accordance with the present invention is for solving the above-mentioned problem of the variable resistance element 3 according to the conventional technique. Specifically, the variable resistance element 1 is for reducing a forming voltage at the time of forming without causing a leakage current to increase.

A variable resistance element 1 in accordance with First Embodiment of the present invention is described below with reference to FIGS. 1 through 9.

(Arrangement of Variable Resistance Element 1)

Figure 1:
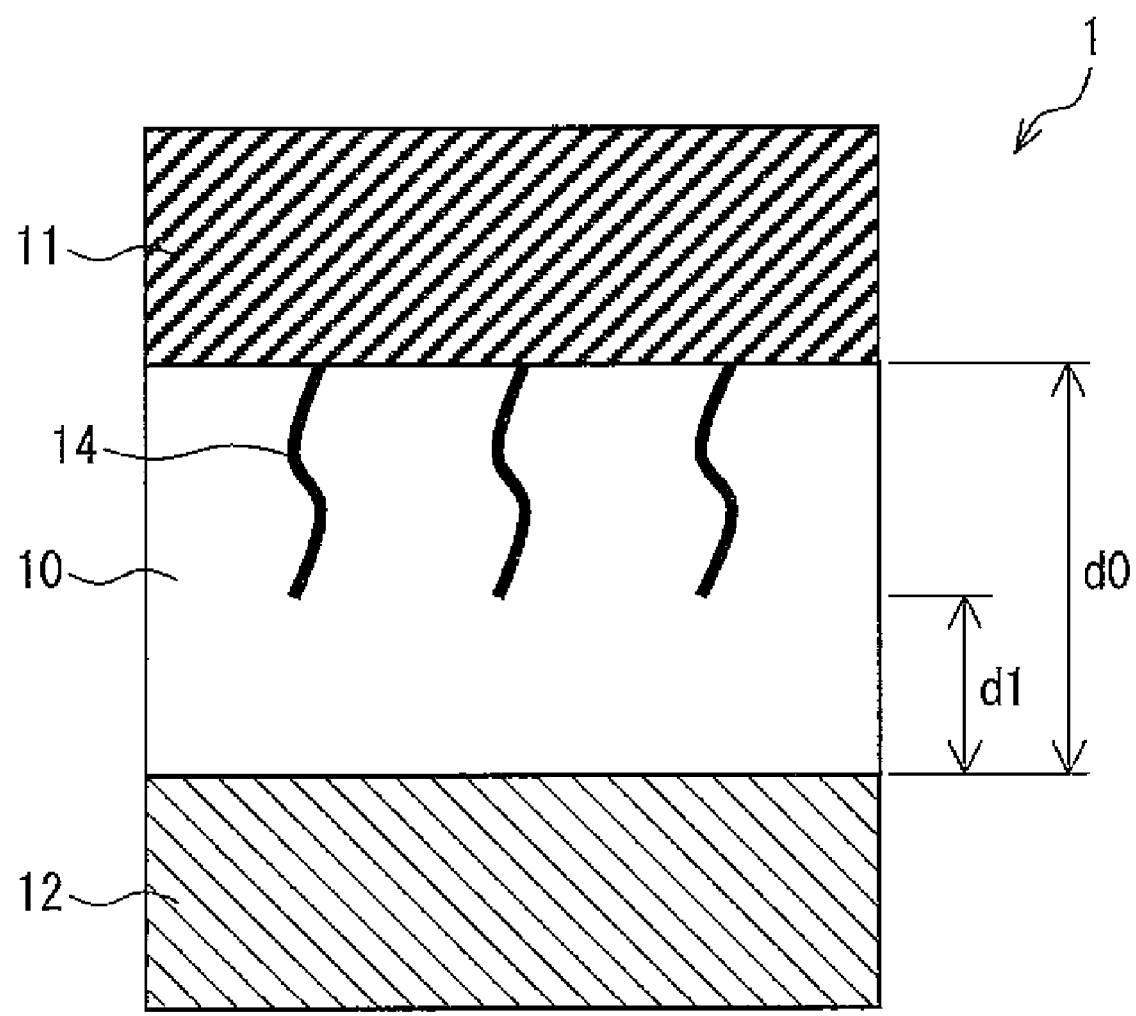
FIG. 1 is a cross-sectional view showing a structure of a variable resistance element before a forming process in accordance with an embodiment of the present invention.
Figure 2:
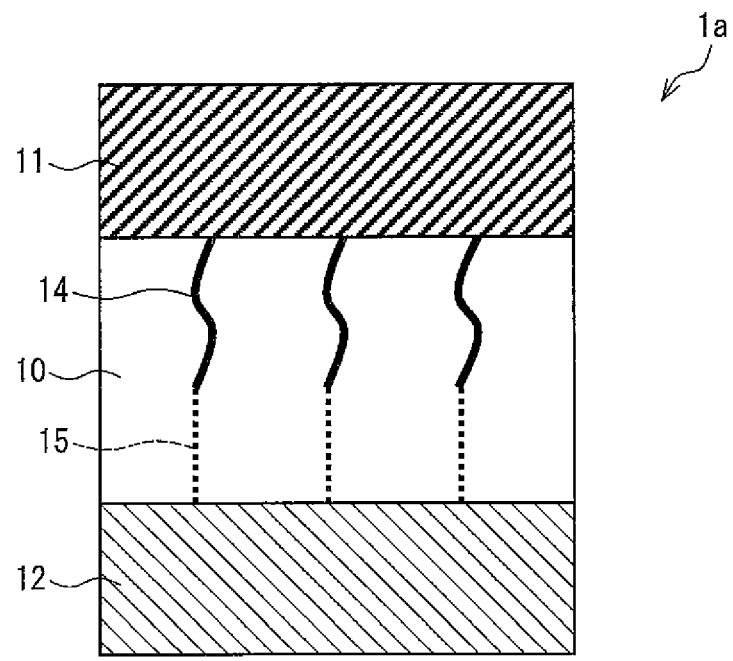
FIGS. 2(a) and 2(b) are cross-sectional views each showing a structure of a variable resistance element after a forming process in accordance with an embodiment of the present invention.
Figure 2:
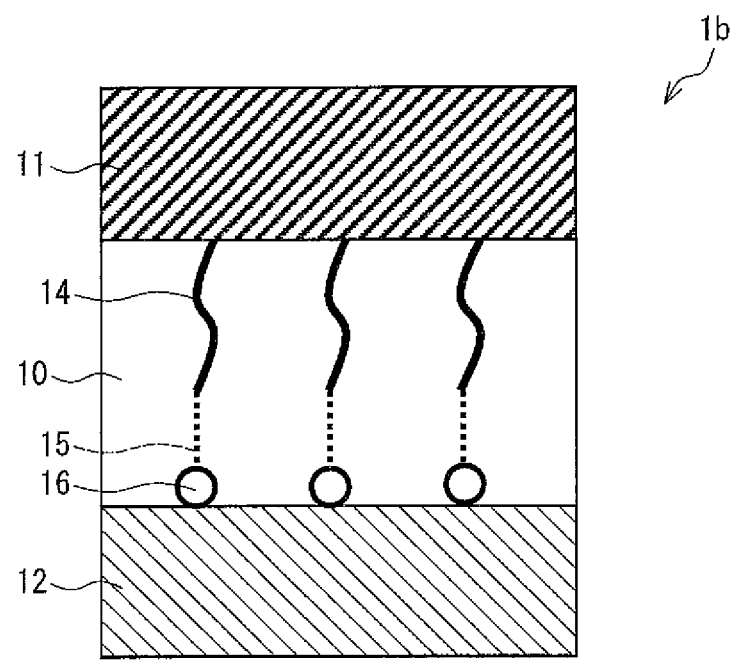

FIG. 1 is a cross-sectional view showing a structure of a variable resistance element 1 in accordance with First Embodiment. As shown in FIG. 1, the variable resistance element 1 has electrodes 11 and 12, and a metal oxide layer 10 made of a metal oxide material sandwiched between the electrodes 11 and 12. Further, the variable resistance element 1 has, inside the metal oxide layer 10, a low resistance material 14 having a lower electrical resistance than the metal oxide material. The low resistance material 14 in the variable resistance element 1 shown in FIG. 1 is in contact with the electrode 11, and is out of contact with the electrode 12. In addition, as shown in FIG. 1, the distance between the electrode 11 and the electrode 12, in other words, the film thickness of the metal oxide layer 10, is represented as a distance d0. The distance between the low resistance material 14 and the electrode 12 is represented as a distance d1.

In case where the low resistance material 14 is locally provided inside the metal oxide layer 10 as shown in FIG. 1, a film thickness that determines the forming voltage corresponds to the distance d1 shown in FIG. 1. In contrast, in case where the low resistance material 14 is not provided, the forming voltage has such a value that is determined by the distance d0, which is between the electrode 11 and the electrode 12. That is to say, it becomes possible to reduce the forming voltage by having the low resistance material 14. Moreover, in this case, it is possible to make the distance d0 large, in other words, it is not necessary to make the distance d0 small in order to suppress a leakage current that passes through the metal oxide layer 10 excluding a filament part. Therefore, it is possible to suppress a reduction in the ratio of resistance change of the variable resistance element 1.

As described above, the variable resistance element 1 in accordance with First Embodiment has the low resistance material 14 inside the metal oxide layer 10 so that the forming voltage can be reduced without thinning the metal oxide layer 10, in other words, without causing the leakage current to increase.

(Low Resistance State and High Resistance State)

Described below with reference to FIGS. 2(a) and 2(b) are variable resistance elements 1a and 1b that are obtained by carrying out a forming in the variable resistance element 1 so that a filament 15 is formed in a metal oxide layer 10. FIG. 2(a) is a cross-sectional view showing a structure of the variable resistance element 1a after the forming process, which is in a low resistance state. FIG. 2(b) is a cross-sectional view showing a structure of the variable resistance element 1b after the forming process, which is in a high resistance state.

As shown in FIG. 2(a), in the variable resistance element 1a, the filament 15 connects a low resistance material 14 to the electrode 12 when a threshold voltage for a set operation (hereinafter referred to as "set voltage") is applied to electrodes 11 and 12 after the filament 15 is formed inside the metal oxide layer 10 by the forming. As a result, the variable resistance element 1a comes into the low resistance state. On the other hand, as shown in FIG. 2(b), the filament 15 becomes disconnected at a filament disconnection section 16 when a threshold voltage for a reset operation (hereinafter referred to as "reset voltage") is applied to the electrodes 11 and 12 after the filament 15 is formed. As a result, the variable resistance element 1b comes into the high resistance state.

Figure 3:
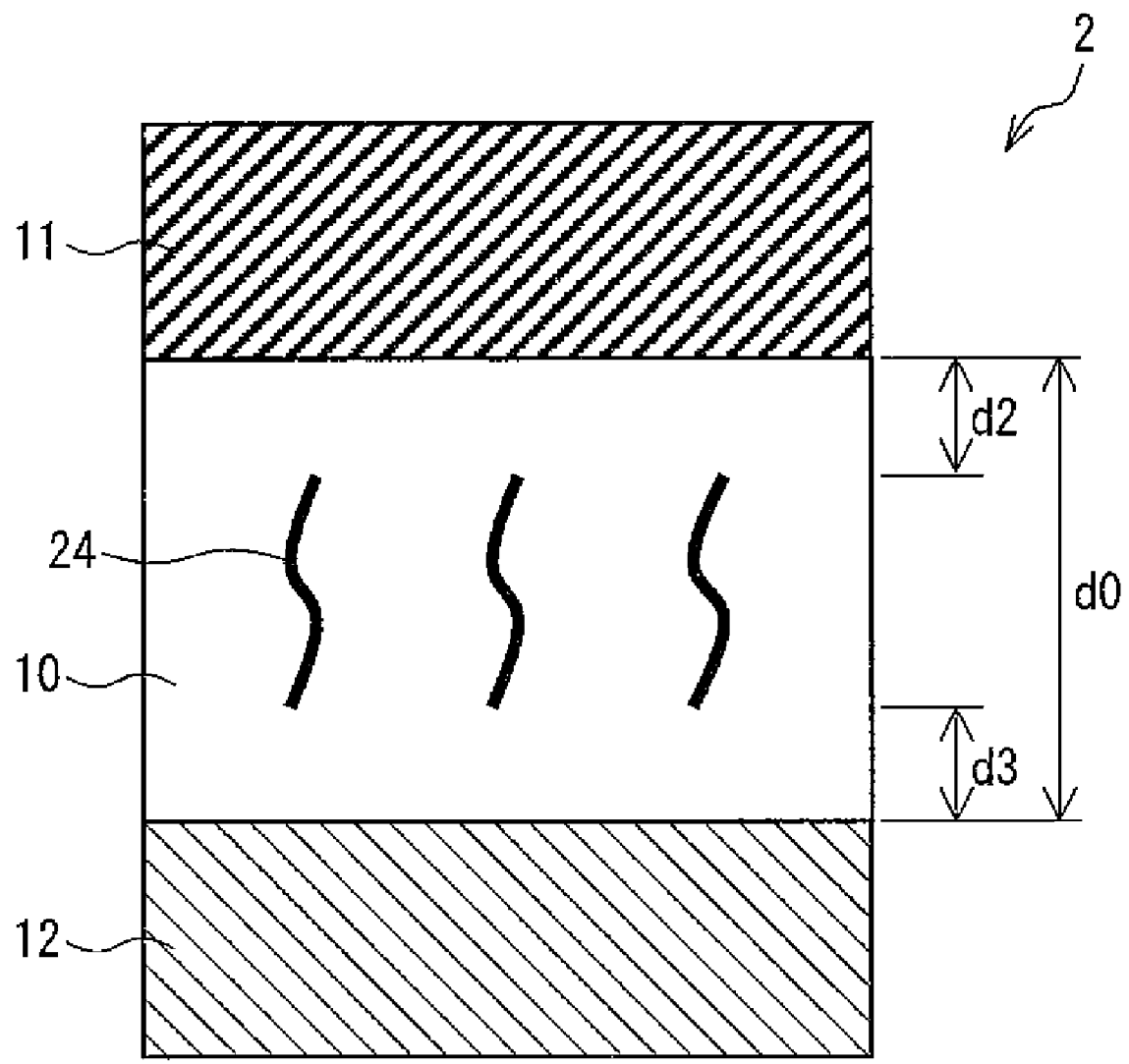
FIG. 3 is a cross-sectional view showing a structure of a variable resistance element before a forming process in accordance with an embodiment of the present invention, which variable resistance element has a low resistance material that is not in contact with two electrodes.
Figure 4:
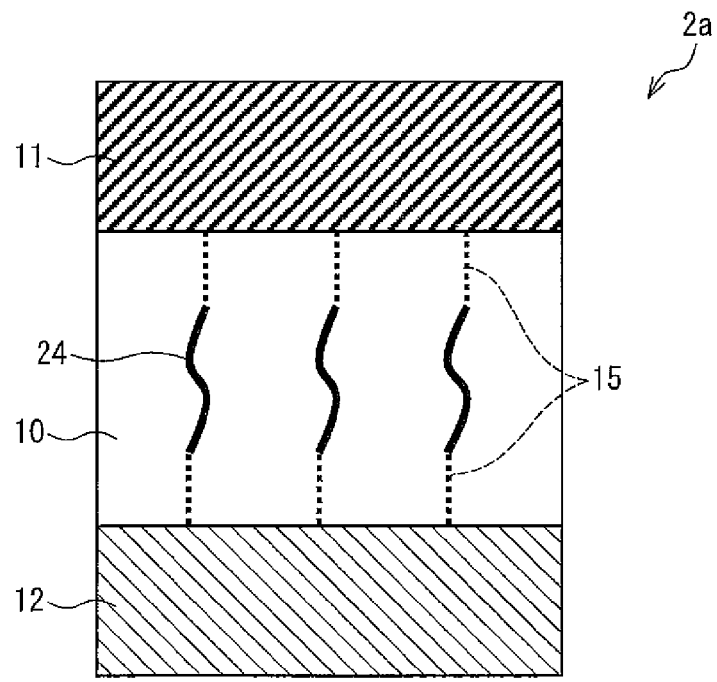
FIGS. 4(a) and 4(b) are cross-sectional views each showing a structure of a variable resistance element in accordance with an embodiment of the present invention, which variable resistance element is obtained by carrying out a forming process in the variable resistance element shown in FIG. 3.
Figure 4:
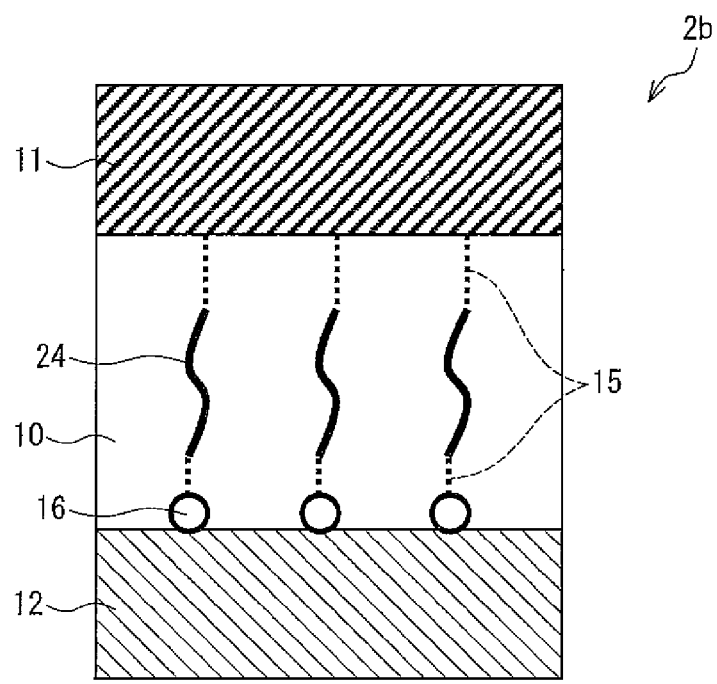

(Variants of Low Resistance Material 14) In the variable resistance element 1 shown in FIG. 1, the low resistance material 14 is in contact with the electrode 11 and is out of contact with the electrode 12. However, it is also possible to arrange the low resistance material 14 as shown in FIG. 3. FIG. 3 is a cross-sectional view showing a structure of a variable resistance element 2, which is a variant of the variable resistance element 1.

As shown in FIG. 3, the variable resistance element 2 differs from the variable resistance element 1 in that, instead of the low resistance material 14, a low resistance material 24, which is out of contact with both electrodes 11 and 12, is provided in a metal oxide layer 10. As shown in FIG. 3, the low resistance material 24 is separated at a distance d2 from the electrode 11 and is separated at a distance d3 from the electrode 12.

When a forming process is carried out in the variable resistance element 2, a forming voltage is determined by a film thickness corresponding to a sum of the distance d2 and the distance d3 shown in FIG. 3. Therefore, it is possible to lower the forming voltage compared to a variable resistance element having no low resistance material 24. Additionally, the variable resistance element 2 enables to suppress a leakage current in the same manner as the variable resistance element 1 shown in FIG. 1.

Described below with reference to FIGS. 4(a) and 4(b) are variable resistance elements 2a and 2b that are obtained by carrying out a forming process in the variable resistance element 2 so that a filament 15 is formed in a metal oxide layer 10. FIG. 4(a) is a cross-sectional view showing a structure of the variable resistance element 2a after the forming process, which is in a low resistance state. FIG. 4(b) is a cross-sectional view showing a structure of the variable resistance element 2b after the forming process, which is in a high resistance state.

As shown in FIG. 4(a), in the variable resistance element 2a, the filament 15 is formed inside the metal oxide layer 10 by the forming so as to extend from the low resistance material 24 to both of the electrodes 11 and 12. The filament 15 connects the low resistance material 24 to each of the electrodes 11 and 12 when a set voltage is applied to the electrodes 11 and 12 after the filament 15 is formed. As a result, the variable resistance element 2a comes into the low resistance state. On the other hand, as shown in FIG. 4(b), the filament 15 becomes disconnected at a filament disconnection section 16 when a reset voltage is applied to the electrodes 11 and 12 after the filament 15 is formed. As a result, the variable resistance element 2b comes into the high resistance state. In FIG. 4(b), the filament disconnection section 16 is provided in the filament 15 that connects the electrode 12 and the low resistance material 24. However, the filament disconnection section 16 may be provided in the filament 15 that connects the electrode 11 and the low resistance material 24, or may be provided in both of the filaments 15 on the electrode 11 side and on the electrode 12 side.

In the variable resistance elements 1 and 2, a single continuous low resistance material 14 or 24 is formed in a thickness direction of the metal oxide layer 10 (in a direction parallel to a normal line of boundary surfaces between the metal oxide layer 10 and each of the electrodes 11 and 12). However, this is only for simplifying an explanation, and therefore it is also possible to provide a plurality of the low resistance material 14 or 24. Needless to say, this case also attains such an effect that the film thickness of the metal oxide layer 10 can be locally reduced, that is, effect that the forming voltage is reduced without causing the leakage current to increase. Further, the low resistance material 14 is provided so as to be in contact with the electrode 11, however, may be provided so as to be in contact with the electrode 12. Furthermore, the variable resistance element in accordance with the present invention may have both of the low resistance material 14 in contact with the electrode 11 and the low resistance material 14 in contact with the electrode 12. When the forming process is carried out in this variable resistance element, the filament 15 is formed between the low resistance material 14 in contact with the electrode 11 and the low resistance material 14 in contact with the electrode 12. This case also attains such an effect that the film thickness of the metal oxide layer 10 can be locally reduced, that is, effect that the forming voltage is reduced without causing the leakage current to increase.

(Method for Producing Variable Resistance Element)

A method for producing a variable resistance element before a forming process in accordance with the present invention is described below with reference to FIGS. 5(a) through 5(e). FIGS. 5(a) through 5(e) are cross-sectional views each showing a structure of the variable resistance element in respective steps of a producing process.

First, as shown in FIG. 5(a), a Ti layer 19, a Pt layer 12 served as a lower electrode (corresponding to the electrode 12 shown in FIG. 1), and a metal oxide layer 10 are stacked in this order by RF magnetron sputtering on a Si substrate 17 on which a silicon oxide film 18 is formed. As a result, a laminate of Ti/Pt/metal oxide layer is formed. The Ti layer 19 plays a role as an adhesive material for enhancing adhesion of the Pt layer 12 served as the lower electrode to the substrate 17 on which the silicon oxide film 18 is formed. The Ti layer 19 is formed by sputtering a Ti target with a 100% Ar gas at an RF power of 200 W, a pressure of 0.5 Pa, and a substrate temperature of a room temperature. The Pt layer 12 is formed by a sputtering with a 100% Ar gas at an RF power of 100 W, a pressure of 0.3 Pa, and a substrate temperature of a room temperature.

Further, the metal oxide layer 10 is formed and stacked by sputtering in an Ar atmosphere at an RF power of 200 W, a gas pressure of 0.5 PA, and a substrate temperature of a room temperature. The composition of the metal oxide layer 10 can be controlled accordingly by adding an $O_2$ gas.

The metal oxide layer 10 is made from at least one oxide of metal selected from Co, Ni, Ti, V, Cu, W, Nb, and Mn. The thickness of the metal oxide layer 10 can be arranged arbitrarily, provided that a leakage current of not more than a certain value passes through the metal oxide layer 10. For example, the metal oxide layer 10 may be 50 nm in thickness.

Next, as shown in FIG. 5(b), a device isolation is carried out by photolithography using an i-line reduced projection exposure apparatus and by Ar ion milling. The Ar ion milling is carried out by applying a voltage of 300V. The photolithography in the present embodiment may be carried out by electron beam lithography or the like. After the Ar ion milling, a remained photoresist 20 is removed so that the metal oxide layer 10 becomes exposed.

Figure 5:
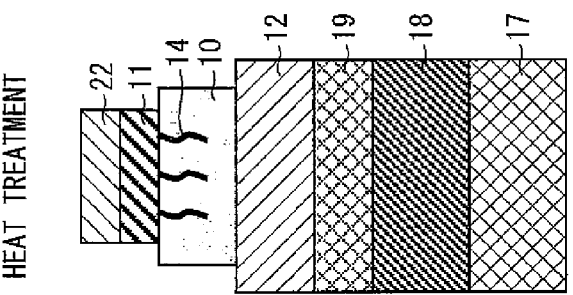
FIGS. 5(a) through 5(e) are cross-sectional views each showing a structure of a variable resistance element in each producing step in accordance with an embodiment of the present invention.
Figure 5:
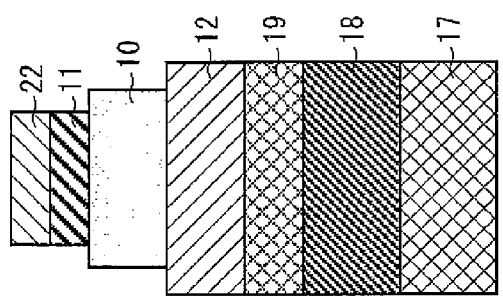
Figure 5:
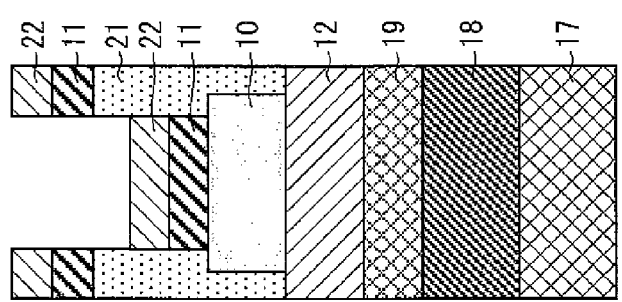
Figure 5:
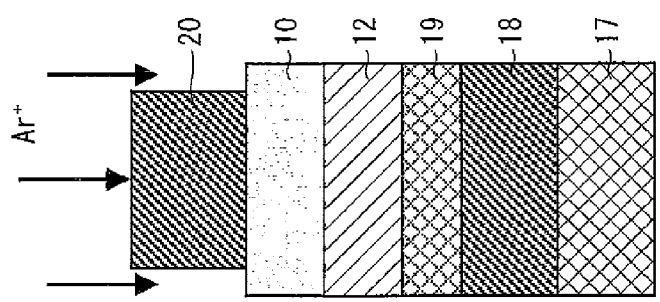
Figure 5:
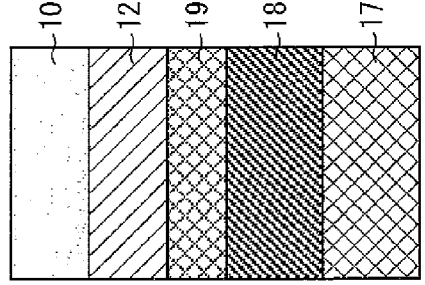

Then, as shown in FIG. 5(*c*), a photoresist 21, which is different from the photoresist 20, is applied to the Pt layer 12 and the metal oxide layer 10. Further, a metal layer served as an upper electrode 11, and a Pt layer 22 served as a capping layer are stacked in this order by RF magnetron sputtering on the upper surface of the structure including components up to the photoresist 21. As shown in FIG. 5(*c*), this causes two regions: (i) a region where the upper electrode 11 and the Pt layer 22 are laminated on the metal oxide layer 10; and (ii) a region where the upper electrode 11 and the Pt layer 22 are laminated on the photoresist 21. The metal layer served as the upper electrode 11 was formed and stacked by RF magnetron sputtering in an Ar atmosphere at a substrate temperature of a room temperature. The metal layer served as the upper electrode 11 was 50 nm in thickness, for example. Further, the Pt layer 22 served as the capping layer for inhibiting oxidization is formed in the same way as the Pt layer 12 served as the lower electrode.

Then, as shown in FIG. 5(*d*), the photoresist 21 is removed together with the upper electrode 11 and the Pt layer 22 that are stacked on the photoresist 21, so that the Pt layer 12 served as the lower electrode becomes exposed.

A low resistance material 14 shown in FIG. 5(*e*) is formed by a heat treatment. Specifically, the heat treatment causes an element constituting the upper electrode 11 to be diffused into the metal oxide layer 10 so that the low resistance material 14 is formed inside the metal oxide layer 10. The low resistance material 14 may be formed only with the diffused element constituting the upper electrode 11, or may be formed by a reaction between the diffused element and an element constituting the metal oxide layer 10. For example, the low resistance material 14 may be formed with the diffused element that has become reduced by taking oxygen from the metal oxide material constituting the metal oxide layer 10.

In addition, the metal oxide layer 10 is preferably a polycrystal. With the polycrystal, it becomes easier to locally form the low resistance material 14 because of grain boundary diffusion. Further, with the polycrystal, the heat treatment causes a metal to deposit on a grain boundary of the metal oxide material constituting the metal oxide layer 10, so that the low resistance material 14 can be formed. The variable resistance element is arranged so as to have a cross-section shown in FIG. 5(*d*) in view of simplification of production of the variable resistance element and simplification of experiments. Therefore, the cross-section is not limited to this. Further, in the method for producing the variable resistance element in accordance with the present invention, the layers may be formed by known methods, other than the above-mentioned method, such as laser ablation, chemical vapor deposition (CVD), and oxidization of metal (surface).

COMPARISON WITH REFERENTIAL EXAMPLE

Figure 6:
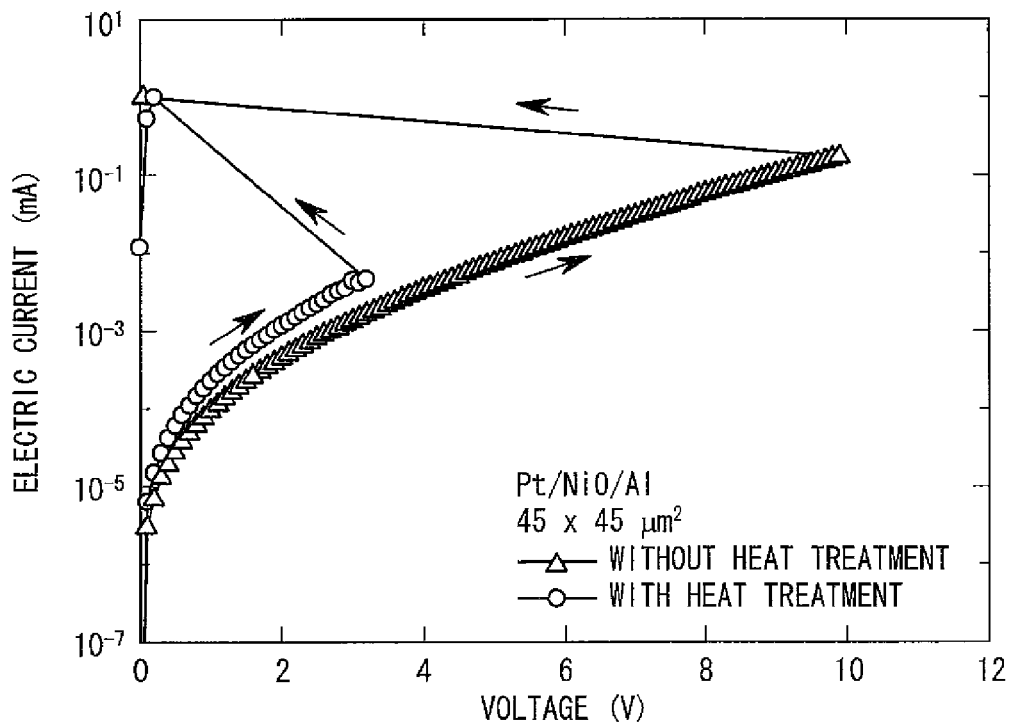
FIG. 6 is a graph showing a current-voltage characteristic exhibited at the time of forming by a variable resistance element in accordance with an embodiment of the present invention, which is/is not subjected to a heat treatment.

In terms current-voltage characteristic during the forming process, the variable resistance element produced by the method shown in FIGS. 5(*a*) through 5(*e*), in other words, the variable resistance element that had been subjected to a heat treatment so that the low resistance material 14 is provided inside the metal oxide layer 10, was compared with the variable resistance element that had not been subjected to the heat treatment so that the low resistance material 14 is not provided inside the metal oxide layer 10. FIG. 6 shows results of the comparison. The heat treatment in the method for producing the variable resistance element is carried out in an Ar atmosphere under a reduced pressure of 0.5 Pa at 300° C. for 10 minutes.

FIG. 6 is a graph showing the current-voltage characteristic exhibited at the time of forming by the variable resistance element that had/hadn't been subjected to the heat treatment. In the graph shown in FIG. 6, the horizontal axis indicates electric potential difference between two electrodes in the variable resistance element, and the vertical axis indicates electric current passing through the variable resistance element.

As shown in FIG. 6, the variable resistance element that had not been subjected to the heat treatment required the forming voltage of approximately 10V. On the other hand, the variable resistance element that had been subjected to the heat treatment required the forming voltage of approximately 3.5V, which is about one third of the variable resistance element that has not been subjected to the heat treatment. Further, an electric current passing through the variable resistance element that had been subjected to the heat treatment did not increase to a large extent after the forming process, compared to the one that has not been subjected to the heat treatment. This indicates that, with the variable resistance element that is subjected to the heat treatment, it is possible to reduce the forming voltage as well as suppressing the leakage current. Note that the current-voltage characteristic shown in FIG. 6 was measured in such a manner that an electric current limiting resistance of 100 kΩ was inserted into the variable resistance element in series at the time of forming. This aimed to prevent a large electric current from passing at the time of forming, which can cause a break down of the variable resistance element.

Figure 7:
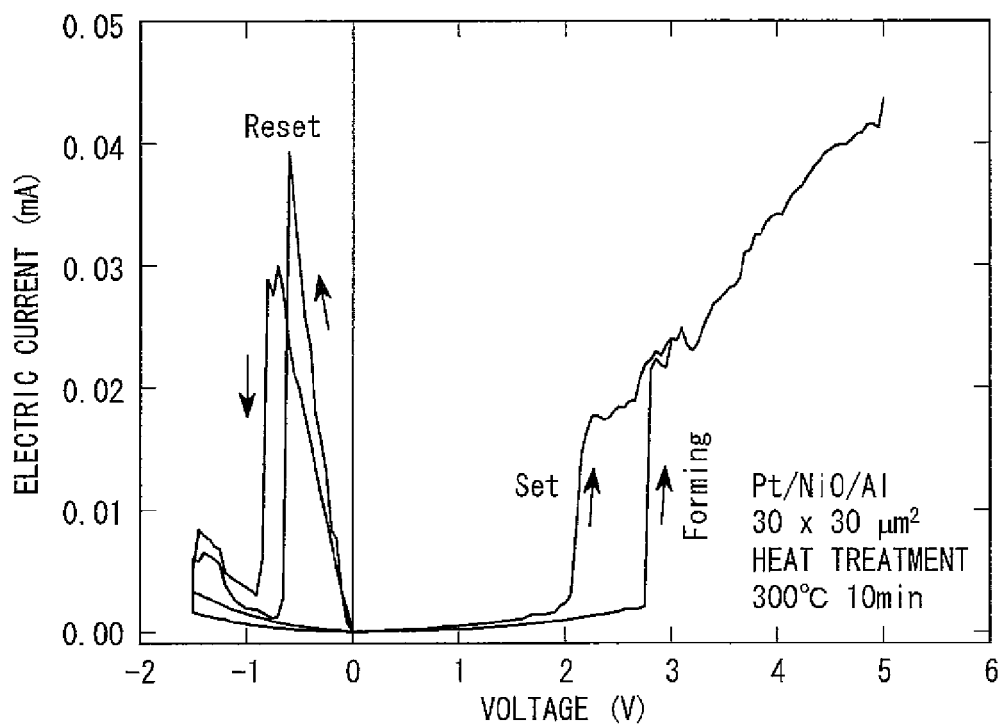
FIG. 7 is a graph showing a current-voltage characteristic of a variable resistance element in accordance with an embodiment of the present invention, to which a forming voltage having a positive polarity, a set voltage, and a reset voltage having a negative polarity are applied.

FIG. 7 shows a current-voltage characteristic exhibited by a variable resistance element at the time of forming and when a set voltage and a reset voltage having different polarities are applied after the forming process. FIG. 7 is a graph showing the current-voltage characteristic of the variable resistance element to which: (i) a positive forming voltage is applied after the heat treatment so that the variable resistance element comes into the low resistance state; (ii) a negative reset voltage is applied; (iii) a positive set voltage is applied; and (vi) a negative reset voltage is applied again. Note that, in the graph shown in FIG. 7, the horizontal axis intends electrical potential difference between two electrodes in the variable resistance element, and the vertical axis intends electric current passing through the variable resistance element.

Figure 8:
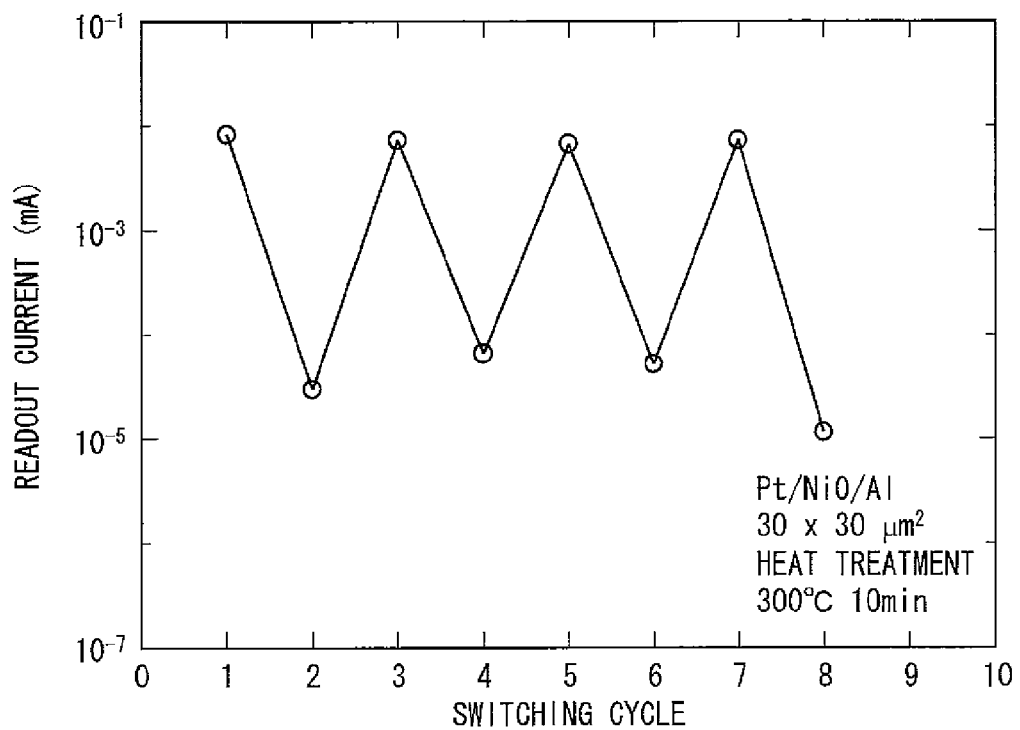
FIG. 8 is a graph showing an amount of readout current passing through a variable resistance element in accordance with an embodiment of the present invention, which readout current is measured every switching operation.

In this regard, set operations and reset operations are alternately carried out in a repeated way in a variable resistance element after the forming process, which has been subjected to the heat treatment. Described with reference to FIG. 8 is a change in electric current that passes through the variable resistance element immediately after each of the set operations and each of the reset operations in case where a readout voltage (0.2V) is applied. The set operations and reset operations are carried out by applying a positive set voltage and a negative reset voltage, respectively. FIG. 8 is a graph showing a change in electric current that passes through the variable resistance element immediately after the set and reset operations in case where the readout voltage is applied. In a switching cycle indicated by the horizontal axis of FIG. 8, odd number cycles indicate points immediately after the forming process or the set operation, and even number cycles indicate points immediately after the reset operation.

As shown in FIG. 8, the ratio of resistance change becomes such a value that has two figures or more, based on values of the electric current that passes through the variable resistance element immediately after the reset operation in case where the readout voltage is applied and those of the electric current that passes through the variable resistance element immediately after the set operation in case where the readout voltage is applied. This indicates that the variable resistance element that has been subjected to the heat treatment does not have a problem in that the ratio of resistance change is decreased.

Figure 9:
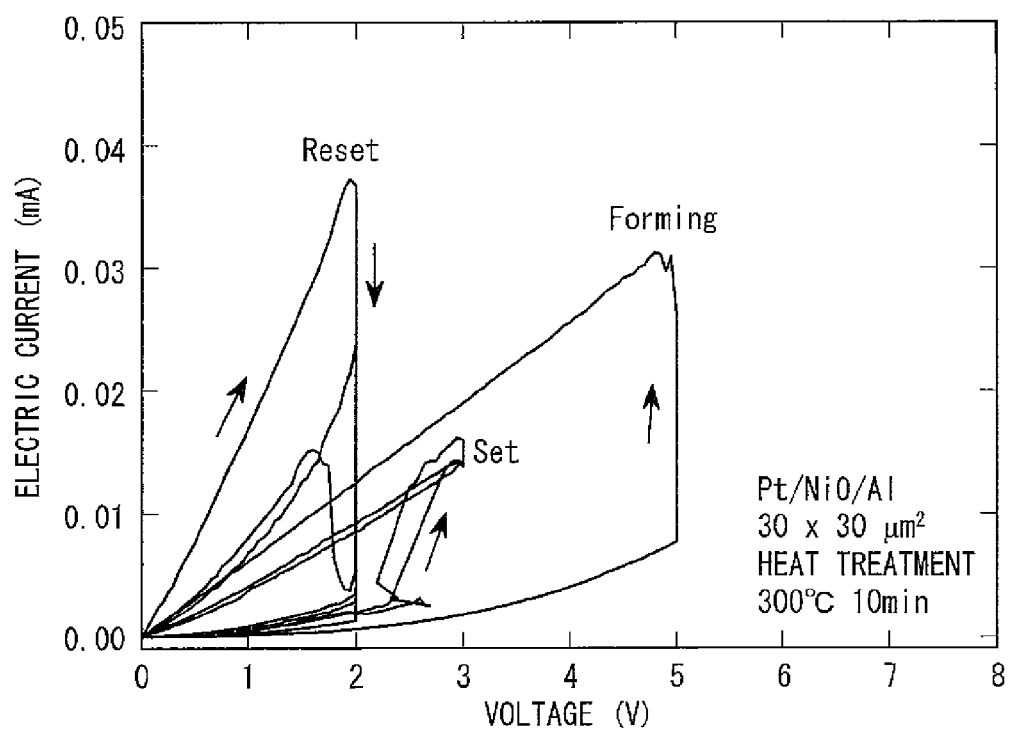
FIG. 9 is a graph showing a current-voltage characteristic of a variable resistance element in accordance with an embodiment of the present invention, to which a forming voltage having a positive polarity, a set voltage, and a reset voltage are applied.

FIG. 9 shows a current-voltage characteristic of a variable resistance element to which a forming voltage, a set voltage, and a reset voltage, which have a same polarity (positive), are applied. In the variable resistance element that has been subjected to the heat treatment, a forming, a reset operation, a set operation, a reset operation, a set operation, and a reset operation are carried out in this order. FIG. 9 is a graph showing the current-voltage characteristic of the variable resistance element when each of the operations is carried out. In the graph in FIG. 9, the horizontal axis indicates electric potential difference between two electrodes in the variable resistance element, and the vertical axis indicates electric current passing through the variable resistance element.

Figure 10:
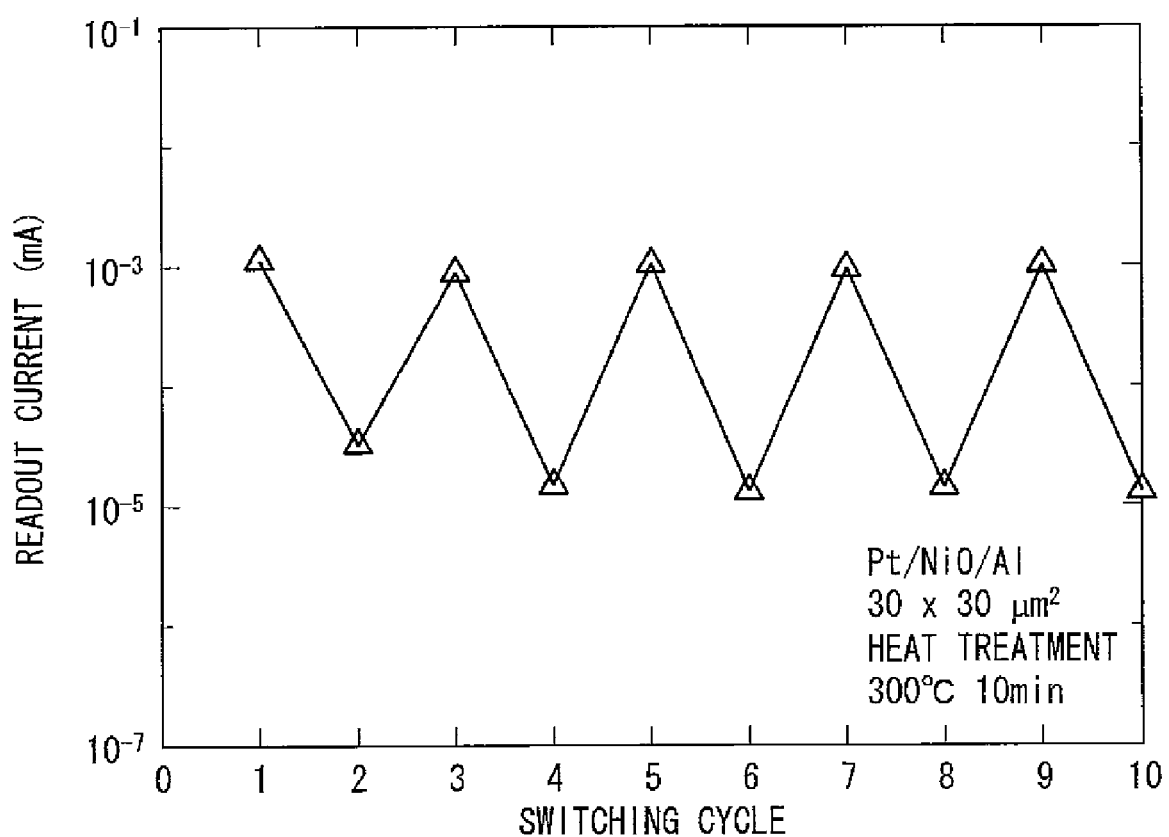
FIG. 10 is a graph showing an amount of readout current passing through a variable resistance element in accordance with an embodiment of the present invention, which readout current is measured every switching operation.

In this regard, set operations and reset operations are alternately carried out in a repeated way in a variable resistance element after the forming process, which has been subjected to the heat treatment. Described with reference to FIG. 10 is a change in electric current that passes through the variable resistance element immediately after each of the set operations and each of the reset operations in case where a readout voltage (0.2V) is applied. The set operations and reset operations are carried out by applying a positive set voltage and a positive reset voltage, respectively. FIG. 10 is a graph showing a change in electric current that passes through the variable resistance element immediately after the set and reset operations in case where the readout voltage is applied. In a switching cycle indicated by the horizontal axis of FIG. 10, odd number cycles indicate points immediately after the forming process or the set operation, and even number cycles indicate points immediately after the reset operation.

As shown in FIG. 10, the ratio of resistance change becomes such a value that has two figures or more, based on values of the electric current that passes through the variable resistance element immediately after the reset operation in case where the readout voltage is applied and those of the electric current that passes through the variable resistance element immediately after the set operation in case where the readout voltage is applied. This indicates that the variable resistance element that has been subjected to the heat treatment does not have a problem in that the ratio of resistance change is decreased.

When measuring the current-voltage characteristic shown in FIGS. 7 and 9, and measuring the electric current shown in FIGS. 8 and 10, which passes at the time of the reset operations and set operations in case where the readout voltage is applied, the measurement during the forming process and set operation was carried out with an electric current limiting resistance of 100 kΩ inserted in the variable resistance element in series. This aimed at preventing a large electric current from passing at the time of forming, which can cause a break down of the variable resistance element.

Figure 11:
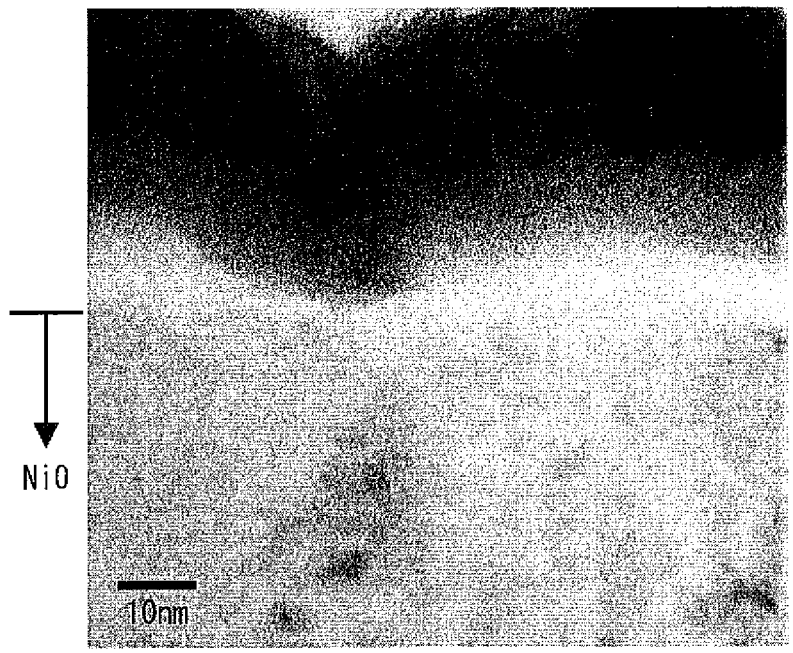
FIG. 11(a) is a view showing a TEM image of a cross-section of a conventional variable resistance element.
FIG. 11(b) is a view showing a TEM image of a cross-section of a variable resistance element in accordance with an embodiment of the present invention.
Figure 11:
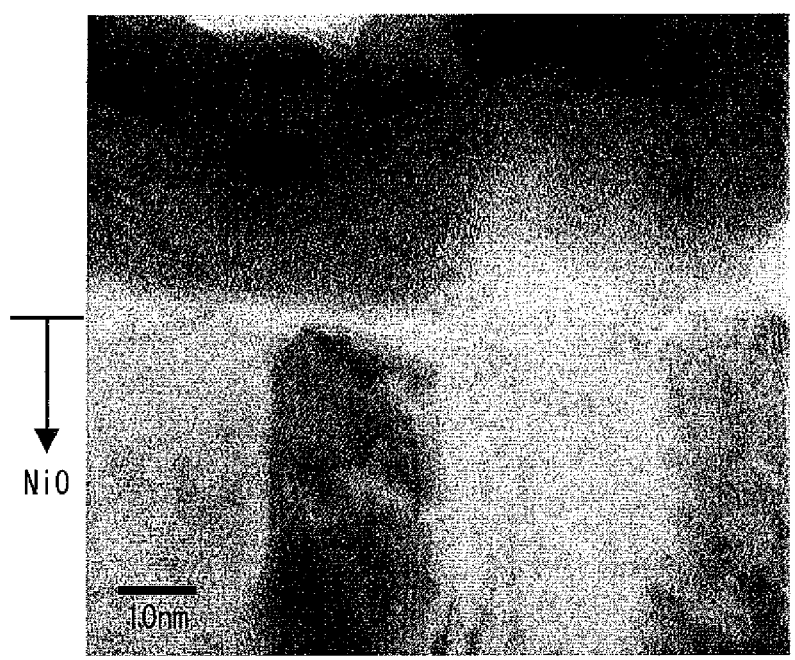

Shown in FIGS. 11(a) and 11(b) are images, taken by using a transmission electron microscope (TEM), showing respective cross-sections of a variable resistance element that is not subjected to a heat treatment (corresponds to a variable resistance element according to a conventional technique) and of a variable resistance element that has been subjected to the heat treatment. FIG. 11(a) is a view showing a TEM image of the variable resistance element that is not subjected to the heat treatment. FIG. 11(b) is a view showing a TEM image of the variable resistance element that has been subjected to the heat treatment.

Note that each of the TEM images shown in FIGS. 11(a) and 11(b) shows a boundary face between a metal oxide layer 10 made of a nickel oxide, and an electrode 11 made from Al (Aluminium), having a thickness of 20 nm. Further, the variable resistance elements shown in the TEM images of FIGS. 11(a) and 11(b) have almost the same structure as the variable resistance element that exhibits the current-voltage characteristic shown in FIG. 6 at the time of forming.

As shown in FIGS. 11(a) and 11(b), the nickel oxide constituting the metal oxide layer 10 is a column crystal. This makes it easier for Al in the electrode 11 to cause grain boundary diffusion. Based on this, it is considered that Al in the electrode 11 is diffused in the metal oxide layer 10 so that a low resistance material is formed near the grain boundary of the nickel oxide with the diffused Al itself or nickel that has become reduced because of the diffused Al which takes oxygen from the nickel oxide.

Figure 12:
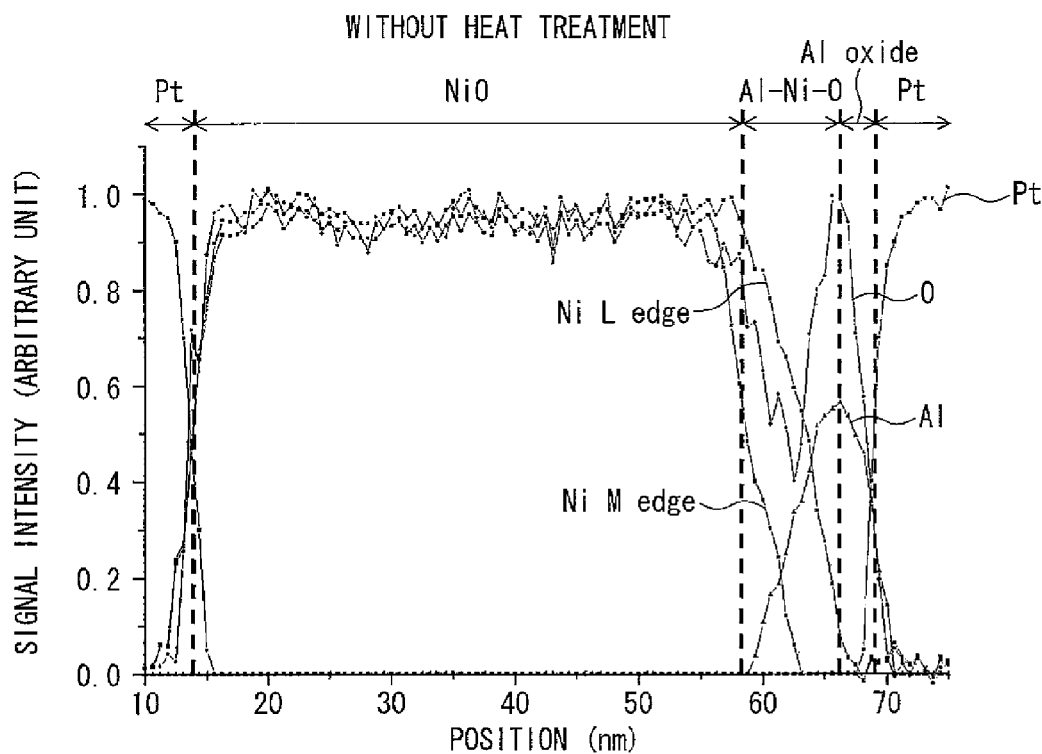
FIG. 12(a) is a graph showing an element distribution in a cross-section of a conventional variable resistance element.
FIG. 12(b) is a graph showing an element distribution in a cross-section of a variable resistance element in accordance with an embodiment of the present invention.
Figure 12:
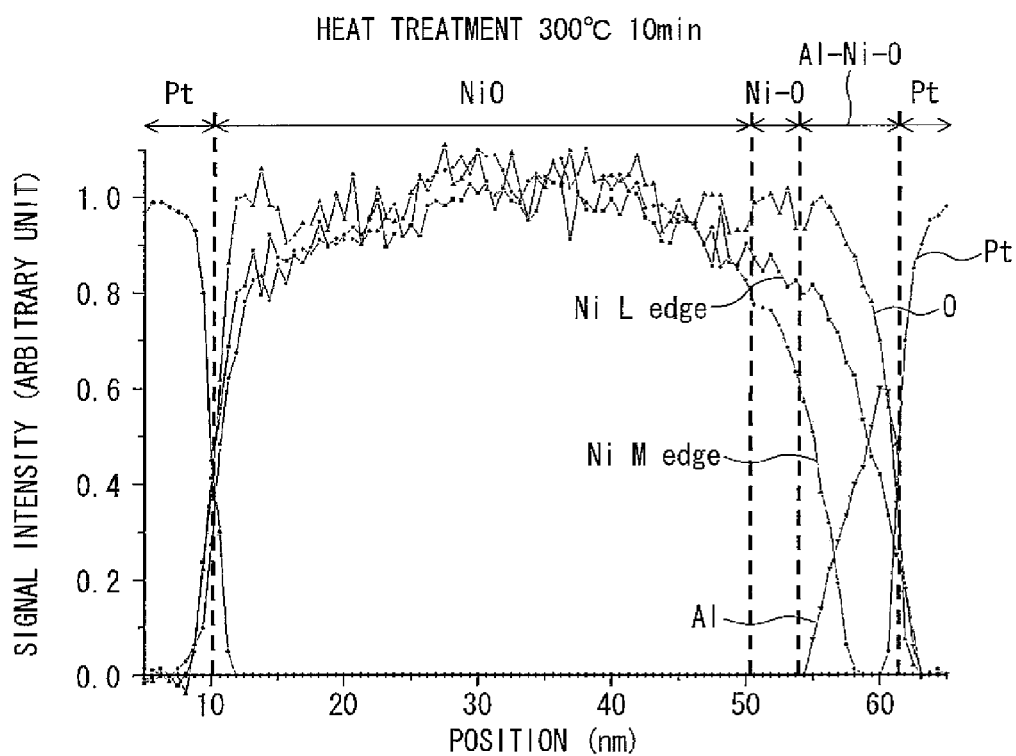

Next, measured by an electron energy loss spectroscopy (EELS) are an element distribution (EELS intensity distribution) in a variable resistance element that is not subjected to a heat treatment, and that in a variable resistance element that has been subjected to the heat treatment. FIGS. 12(a) and 12(b) show the results thereof. FIG. 12(a) is a graph showing the element distribution in the variable resistance element that is not subjected to the heat treatment. FIG. 12(b) is a graph showing the element distribution in the variable resistance element that has been subjected to the heat treatment. The variable resistance elements that are subjected to the measurement shown in FIGS. 12(a) and 12(b) are obtained by forming a Pt layer served as the lower electrode 12, a nickel oxide layer served as the metal oxide layer 10, an Al layer served as the upper electrode 11, and a Pt layer served as the capping layer 22 in this order. This is almost same as the variable resistance element that exhibits the current-voltage characteristic shown in FIG. 6 during the forming process.

As shown in FIG. 12(a), the following two layers occur in a region where the nickel oxide is in contact with Al: (i) a layer including nickel, aluminium, and oxygen; and (ii) a layer including aluminium oxide. The nickel oxide layer served as the metal oxide layer 10 has a substantially uniform composition distribution. A layer including Al as a metal cannot be found in FIG. 12(a). This is because a sample used in the measurement included a thin Al layer, and therefore Al is completely oxidized. The variable resistance element shown in FIG. 6 includes a metal Al layer.

Meanwhile, FIG. 12(b) shows the element distribution in the variable resistance element that has been subjected to the heat treatment. Particularly in distributions of oxygen and nickel in particular, FIG. 12(b) differs from FIG. 12(a), which shows the element distribution in the variable resistance element that is not subjected to the heat treatment. In FIG. 12(b), oxygen is uniformly distributed, and EELS signal intensity indicative of nickel decreases near a boundary face of the electrode. That is to say, near the boundary face between the nickel oxide and the electrode, in other words, in a region between the metal oxide layer 10 and the electrode 11, (i) a nickel oxide layer including excessive oxygen and (ii) a layer including nickel, aluminium, and oxygen are formed. Therefore, it can be determined that the heat treatment causes the variable resistance element to include a first region and a second region near the boundary face between the nickel oxide constituting the metal oxide layer 10 and Al constituting the electrode 11. The first region is a transition layer having a high oxygen/metallic element ratio (proportion of number of oxygen atoms to that of nickel atoms). The second region is a transition layer including a metal constituting the electrode 11 (Al), a metal constituting the metal oxide material (nickel), and oxygen. Therefore, it is considered that a reduction in the forming voltage can be achieved by applying such a treatment that causes the element distribution described above.

Second Embodiment

A nonvolatile semiconductor storage device 4 (hereinafter referred to as "storage device") in accordance with Second Embodiment of the present invention is described below with reference to FIGS. 13 and 14.

First, an arrangement of the storage device 4 is described with reference to FIG. 13. FIG. 13 is a block diagram showing the arrangement of the storage device 4.

Figure 13:
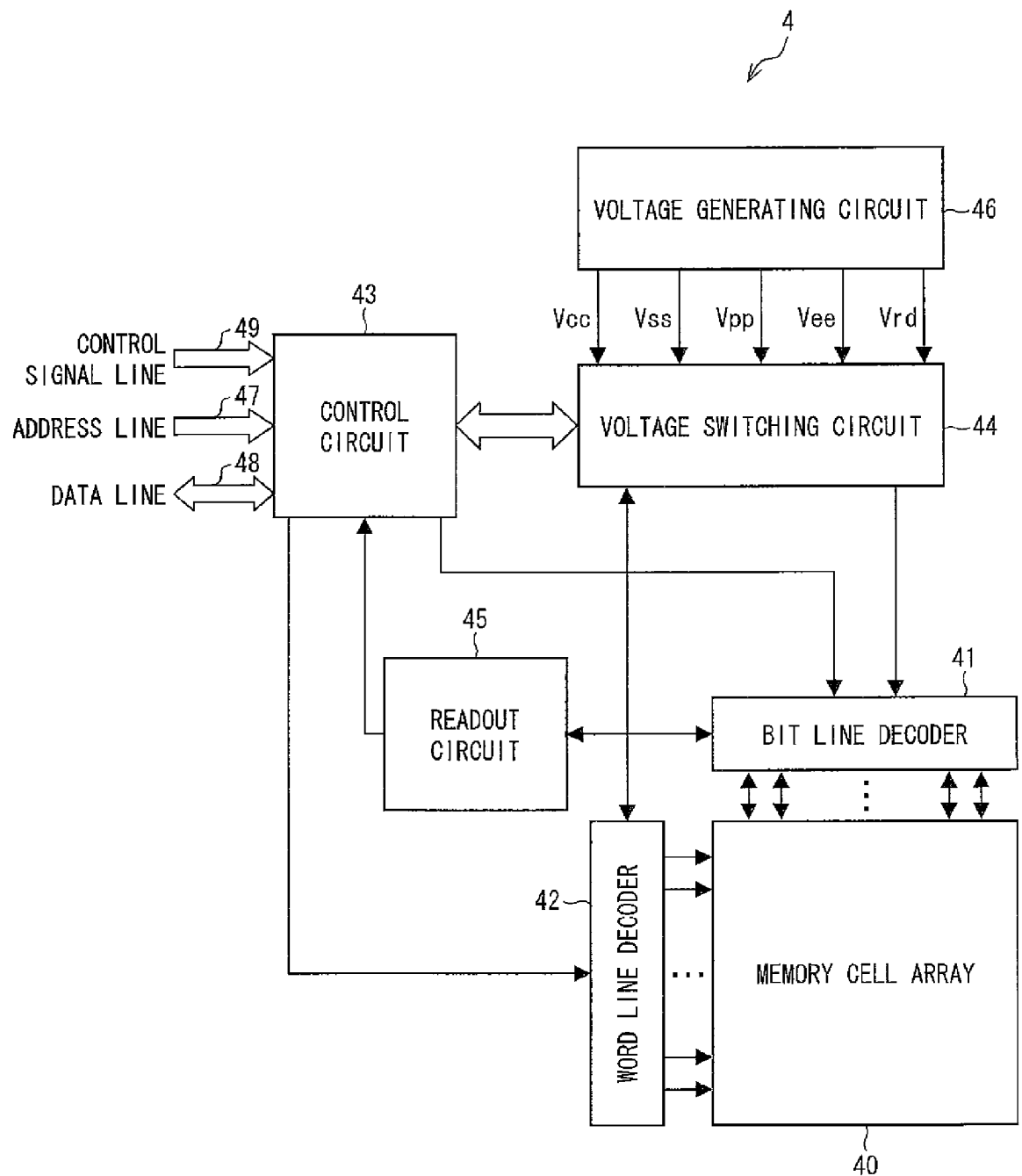
FIG. 13 is a block diagram showing an arrangement of a nonvolatile semiconductor storage device in accordance with another embodiment of the present invention.

As shown in FIG. 13, the storage device 4 has a memory cell array 40, a bit line decoder 41, a word line decoder 42, a voltage switching circuit 44, a readout circuit 45, a voltage generating circuit 46, and a control circuit 43.

An arrangement inside the memory cell array 40 is described below with reference to FIG. 14. FIG. 14 is a schematic view showing the arrangement of the memory cell array 40.

Figure 14:
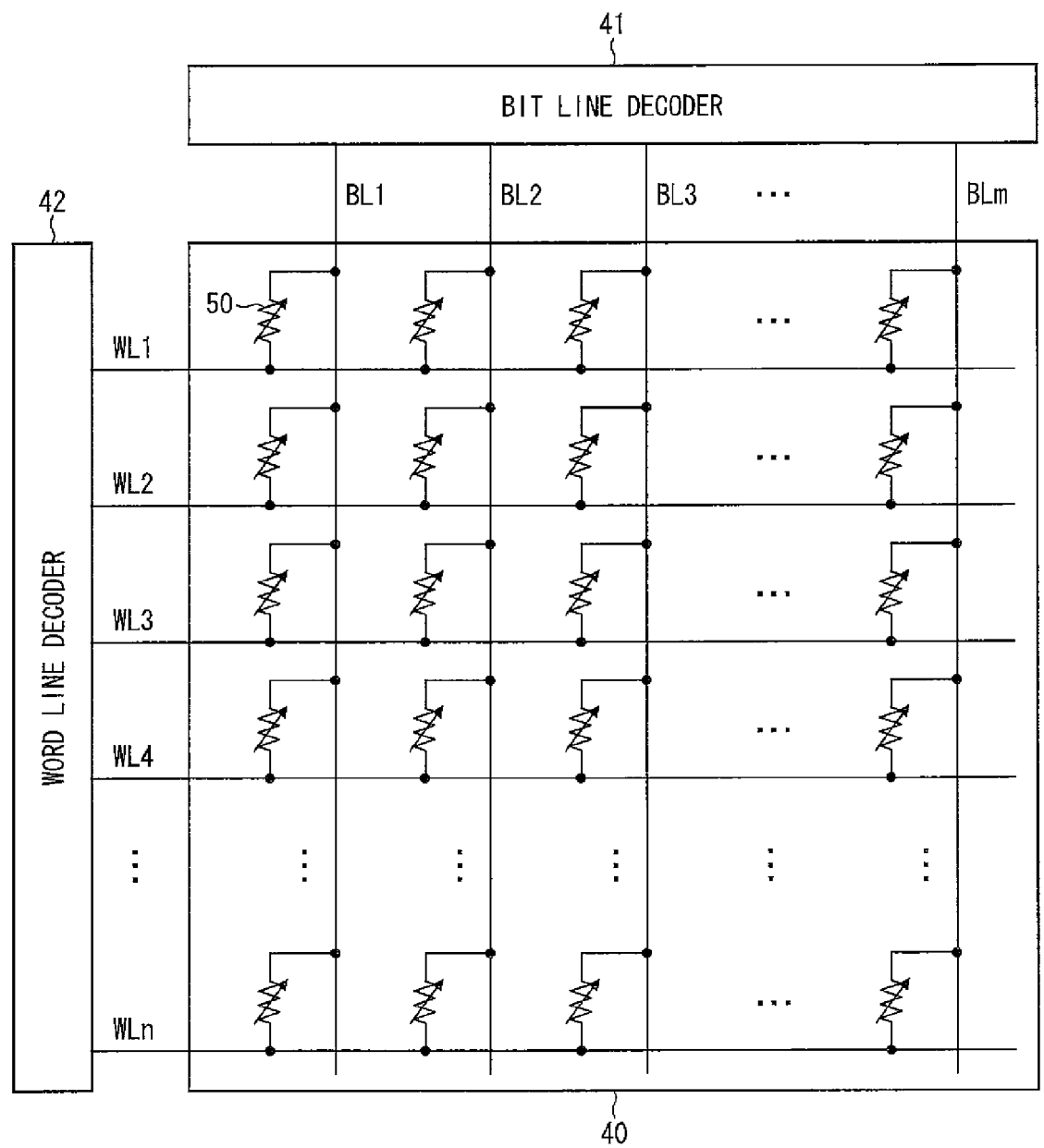
FIG. 14 is a schematic view showing an arrangement of a memory cell array of a nonvolatile semiconductor storage device in accordance with the another embodiment of the present invention.

As shown in FIG. 14, the memory cell array 40 has a plurality of variable resistance elements 1 or 2, described in First Embodiment, as memory cells 50. The plurality of the memory cells 50 are arrayed in a matrix manner in rows and columns. Specifically, the memory cell array 40 is a cross-point array in which m×n number of the memory cells 50 are positioned respectively at intersections of m number of bit lines (column select lines) BL1 through BLm (hereinafter referred to as "bit line BL" when being collectively described) extending in a column direction, and n number of word lines (row select lines) WL1 through WLn (hereinafter referred to as "word line WL" when being collectively described) extending in a row direction. For example, the bit line BL is a line extended in a column direction by connecting electrodes 12 (see FIG. 1) of the memory cells 50 that are arrayed in a same column. Likewise, the word line WL is a line extended in a row direction by connecting electrodes 11 (see FIG. 1) of the memory cells 50 that are arrayed in a same row.

The bit line decoder 41 and the word line decoder 42 have a function as a memory cell selecting circuit for selecting the memory cell 50 in units of row, column, or individual memory cell, via the bit line BL and the word line WL.

The following is described with reference to FIG. 13. The bit line decoder 41 and the word line decoder 42 select, from the memory cell array 40, a memory cell 50 that corresponds to an address signal indicative of a subject to be read out or rewritten, which address signal is inputted to the control circuit 43 via an address line 47. Specifically, the word line decoder 42 selects a word line WL, provided in the memory cell array 40, which corresponds to the address signal inputted via the address line 47. The bit line decoder 41 selects a bit line BL, provided in the memory cell array 40, which corresponds to the address signal inputted via the address line 47.

The control circuit 43 carries out each control of a rewrite operation (corresponds to the set and reset operations described in First Embodiment) of data stored in the memory cell array 40 (hereinafter referred to as "stored data"), and that of a readout operation of the stored data.

In the rewrite/readout operation of the stored data, the control circuit 43 controls the word line decoder 42, the bit line decoder 41, and the voltage switching circuit 44, based on the address signal inputted via the address line 47, a data signal inputted via a data line 48 (only in case of the rewrite operation), and a control input signal inputted via a control signal line 49. By this, the stored data in the memory cell array 40 are read out or rewritten. In the storage device 4 shown in FIG. 13, the control circuit 43 has a function as a general address buffer circuit, data input/output buffer circuit, and control input buffer circuit (not illustrated).

The voltage switching circuit 44 functions as a voltage supplying circuit for changing, depending on the operations, each voltage of the signals inputted to the memory cell array 40 via the word lines WL and the bit lines BL, and for supplying the voltage to the bit line decoder 41 and the word line decoder 42 at the time of rewrite/readout operations of the stored data in the memory cell array 40. In FIG. 13, Vcc intends a source voltage of the device of the present invention; Vss intends a ground voltage; Vpp intends a set voltage; Vee intends a reset voltage; and Vrd intends a readout voltage. Note that the source voltage Vcc and the ground voltage Vss are supplied to the voltage switching circuit 44 from a source outside the storage device 4. Further, each of the voltages of the signals inputted to the memory cell array 40, applied at the time of set operation, reset operation, and readout operation, are generated from the source voltage Vcc or other source voltage by the voltage generating circuit 46.

The readout circuit 45 carries out a voltage conversion of a readout current that passes through a selected bit line BL selected by the bit line decoder 41 among readout currents that pass through bit lines BL connected to selected memory cells 50, which the address signal indicates. Further, the readout circuit 45 transmits the converted signal to the control circuit 43, and determines a state of stored data in a memory cell 50, among the selected memory cells in a row, which is connected to the selected bit line BL so as to be read out. The control circuit 43 outputs, to a data line 48, the signal transmitted from the readout circuit 45.

Next, described below is an example of how a voltage is applied to the memory cell array 40 at the time of rewrite operation. In the present embodiment, the variable resistance element 1 or 2 (see FIG. 1 or 3) used in the memory cell 50 has a switching characteristic shown in FIGS. 7 and 8, for example. That is, when a voltage pulse of set voltage having a positive polarity is applied to the electrode 11 so that the electrode 11 has a higher electric potential than the electrode 12, an electrical resistance of the variable resistance element is switched from a high resistance state to a low resistance state. On the other hand, when a voltage pulse of reset voltage having a negative polarity is applied to the electrode 11 so that the electrode 11 has a lower electric potential than the electrode 12, the electrical resistance of the variable resistance element is switched from the low resistance state to the high resistance state. In the following descriptions, the switching operation is assumed as not being carried out in case where the voltage pulse to be applied has a half voltage magnitude of the set voltage and reset voltage.

At the time of set operation, the bit line decoder 41 and the word line decoder 42 apply a ground voltage Vss (0V) and a set voltage Vpp to a selected bit line BL that is connected to a selected memory cell 50 to be rewritten, and to a selected word line WL that is connected to the selected memory cell 50, respectively. This causes the set voltage Vpp to be applied to the electrode 11 (on the selected word line WL side) of the selected memory cell 50 so that the electrode 11 has a higher electric potential than the electrode 12 (on the selected bit line BL side). As a result, the set operation is carried out. At this point, the bit line decoder 41 and the word line decoder 42 apply a voltage (Vpp/2) that is half of the set voltage Vpp to a non-selected bit line BL and a non-selected word line WL, which are not connected to the selected memory cell 50. As a result, no voltage is applied to both ends of a first non-selected memory cell 50 that is connected to the non-selected bit line BL and the non-selected word line WL. Further, a positive voltage (Vpp/2) that is half of the set voltage is applied to both ends of a second non-selected memory cell 50 that is connected to the selected bit line BL and the non-selected word line WL, and to both ends of a third non-selected memory cell 50 that is connected to the non-selected bit line BL and the selected word line WL, wherein the positive voltage (Vpp/2) is applied to an electrode 11 so that the electrode 11 has a higher electric potential than an electrode 12. Therefore, the set operation is not carried out in any of the non-selected memory cell 50.

At the time of reset operation, the bit line decoder 41 and the word line decoder 42 apply a reset voltage Vee (0V) and a ground voltage Vss to a selected bit line BL that is connected to a selected memory cell 50 to be rewritten, and to a selected word line WL that is connected to the selected memory cell 50, respectively. This causes a negative reset voltage (−Vee) to be applied to the electrode 11 (on the selected word line WL side) of the selected memory cell 50 so that the electrode 11 has a lower electric potential than the electrode 12 (on the selected bit line BL side). As a result, the reset operation is carried out. At this point, the bit line decoder 41 and the word line decoder 42 apply a voltage (Vee/2) that is half of the reset voltage Vee to a non-selected bit line BL and a non-selected word line WL, which are not connected to the selected memory cell 50. As a result, no voltage is applied to both ends of a first non-selected memory cell 50 that is connected to the non-selected bit line BL and the non-selected word line WL. Further, a negative voltage (−Vee/2) that is half of the reset voltage is applied to both ends of a second non-selected memory cell 50 that is connected to the selected bit line BL and the non-selected word line WL, and to both ends of a third non-selected memory cell 50 that is connected to the non-selected bit line BL and the selected word line WL, wherein the negative voltage (−Vee/2) is applied to an electrode 11 so that the electrode 11 has a lower electric potential than an electrode 12. Therefore, the reset operation is not carried out in any of the non-selected memory cell 50.

Next, described below is an example of how a voltage is applied to the memory cell array 40 at the time of readout operation. At the time of readout operation, the bit line decoder 41 and the word line decoder 42 apply a readout voltage Vrd and a ground voltage Vss (0V) to a selected bit line BL that is connected to a selected memory cell 50 to be read out, and to a selected word line WL that is connected to the selected memory cell 50, respectively. This causes the readout voltage (Vrd) to be applied to the electrode 12 (on the selected bit line BL side) of the selected memory cell 50 so that the electrode 12 has a higher electric potential than the electrode 11 (on the selected word line WL side). At this point, a readout current in accordance with a resistance state passes through the selected memory cell 50 from the selected bit line BL to the selected word line WL. The readout current is detected by the readout circuit 45 via the bit line decoder 41 so that the readout operation is carried out.

In Second Embodiment, the electrode 11 and the electrode 12 are connected to the word line and the bit line, respectively. Conversely, the electrode 11 and the electrode 12 may be connected to the bit line and the word line, respectively. Further, in the readout operation, the readout circuit 45 is connected to the bit line decoder 41. However, the readout circuit 45 may be connected to the word line decoder 42.

Moreover, in Second Embodiment, the memory cell 50 is a 1R memory cell using only the variable resistance element described in First Embodiment. The memory cell of the present invention is not limited to this, and may be a 1D/1R memory cell in which the variable resistance element is series-connected to a rectifier element such as a diode. The memory cell also may be a 1T/1R memory cell that includes a series circuit having the variable resistance element and a select transistor (MOSFET, bipolar transistor, and the like).

As described above, a variable resistance element of the present invention is a variable resistance element comprising: a first electrode; a second electrode; a metal oxide material sandwiched between the first and second electrodes; the variable resistance element having an electrical resistance between the first and second electrodes, the electrical resistance changing reversibly in response to a voltage applied between the first and second electrodes; and a low resistance material inside the metal oxide material, the low resistance material being provided so as to be out of contact with at least either one of the first and second electrodes and having a lower electrical resistance than the metal oxide material.

As described above, a variable resistance element of the present invention is a variable resistance element comprising: a first electrode; a second electrode; a metal oxide material sandwiched between the first and second electrodes, the variable resistance element having an electrical resistance, between the first and second electrodes, changing reversibly in response to a voltage applied between the first and second electrodes; a first region and a second region between the metal oxide material and at least either one of the first and second electrodes, the first and second regions being provided in this order from the metal oxide material, the first region including oxygen and a first metal element, the second region being adjacent to the first region and including oxygen, the first metal element, and a second metal element, the first metal element being included in the metal oxide material, and the second metal element constituting at least either one of the first and second electrodes; and in the first region, a ratio of the number of atoms of the oxygen to that of atoms of the first metal element is higher than the ratio in the metal oxide material.

As described above, a method for producing the variable resistance element of the present invention is a method for producing a variable resistance element having a first electrode, a second electrode, and a metal oxide material sandwiched between the first and second electrodes, the variable resistance element having an electrical resistance, between the first and second electrodes, changing reversibly in response to a voltage applied between the first and second electrodes, the method comprising: providing, inside the metal oxide material, a low resistance material having an electrical resistance lower than the metal oxide material and being out of contact with at least either one of the first and second electrodes, by diffusing, into the metal oxide material, an element constituting at least either one of the first and second electrodes.

Therefore, the variable resistance element of the present invention and the method for producing the same make it possible to reduce a forming voltage for providing a conductive section inside the metal oxide material, without causing a leakage current to increase.

The present invention is to provide a variable resistance element capable of reducing the forming voltage for a forming as well as suppressing the leakage current, a method for producing the same, and a nonvolatile storage device having the variable resistance element served as a memory cell. The present invention can be used especially in a mobile or transportable memory.

It is preferable to arrange the variable resistance element in accordance with the present invention so that the low resistance material is made from at least either one of respective elements constituting the first electrode and the second electrode.

With the arrangement, the low resistance material can be formed by processing the first or second electrode. This allows for a simple production of the variable resistance element.

It is preferable to arrange the variable resistance element in accordance with the present invention so that the low resistance material is made from at least one type of a metal element constituting the metal oxide material.

With the arrangement, the low resistance material can be formed by processing the metal oxide material. This allows for a simple production of the variable resistance element.

It is preferable to arrange the variable resistance element in accordance with the present invention so that the metal oxide material is a polycrystal; and the low resistance material is formed at a grain boundary of the metal oxide material.

With the arrangement, the low resistance material can be easily formed at the grain boundary of the metal oxide material because of grain boundary diffusion. Moreover, with the arrangement, the low resistance material can be locally formed in the variable resistance element of the present invention. This makes it possible to reduce an area where the film thickness of the metal oxide material is locally reduced due to the presence of the low resistance material. As a result, it becomes possible to suppress the leakage current.

It is preferable to arrange the variable resistance element in accordance with the present invention so that the low resistance material is provided by causing an element constituting at least either one of the first and second electrodes to be diffused into the metal oxide material by a heat treatment.

With the arrangement, the heat treatment causes the element constituting at least either one of the first and second electrodes to be diffused into the metal oxide material. At this point, the diffused element has an electrical conductivity because of being an element constituting at least either one of the first and second electrodes. That is to say, the low resistance material is provided inside the metal oxide material with the element having an electrical conductivity, which element is diffused into the metal oxide material. Since the element is diffused into the metal oxide material by the heat treatment, the low resistance material can be provided inside the metal oxide material with a metal element constituting the metal oxide material, as a result of the diffused element becoming reduced by taking oxygen from the metal oxide material.

As described above, with the arrangements, it becomes possible to surely form the low resistance material inside the metal oxide material.

The variable resistance element in accordance with the present invention is preferably arranged such that the second metal element is aluminium.

The variable resistance element in accordance with the present invention is preferably arranged such that the metal oxide material is made of a nickel oxide.

The method for producing the variable resistance element in accordance with the present invention is preferably arranged such that the diffusion in the step of providing the low resistance material is carried out by a heat treatment.

With the arrangements, it becomes possible to provide the low resistance material inside the metal oxide material only by the heat treatment. Consequently, the variable resistance element can be more easily produced at lower cost.

The embodiments and concrete examples of implementation discussed in the foregoing detailed explanation serve solely to illustrate the technical details of the present invention, which should not be narrowly interpreted within the limits of such embodiments and concrete examples, but rather may be applied in many variations within the spirit of the present invention, provided such variations do not exceed the scope of the patent claims set forth below.

Furthermore, the variable resistance element of the present invention, the method for producing the same, and the nonvolatile storage device having the variable resistance element served as a storage layer, can be arranged as follows.

(First Arrangement)

A variable resistance element having a metal oxide layer between a first electrode and a second electrode between which an electrical resistance changes reversibly in response to an electrical stress applied between the first and second electrodes, the metal oxide layer partially including a low resistance region whose resistivity is lower than its surrounding.

(Second Arrangement)

The variable resistance element according to First Arrangement, wherein the low resistance region is made from at least one element constituting at least either one of the first and second electrodes.

(Third Arrangement)

The variable resistance element according to First Arrangement, wherein the low resistance region is made from at least one element constituting the metal oxide layer.

(Fourth Arrangement)

The variable resistance element according to Second or Third Arrangement, wherein the low resistance region is provided near a grain boundary of the metal oxide layer.

(Fifth Arrangement)

A method for producing a variable resistance element which has a metal oxide layer between a first electrode and a second electrode between which an electrical resistance changes reversibly in response to an electrical stress applied between the first and second electrodes, the method including diffusing, in the metal oxide layer, an element constituting either one of the electrodes, so as to form the low resistance region in the metal oxide layer.

(Sixth Arrangement)

The method according to Fifth Arrangement, wherein the step of diffusing is carried out by a heat treatment.

(Seventh Arrangement)

A nonvolatile semiconductor storage device having: a memory cell including a variable resistance element according to any one of First through Fourth Arrangements; data rewriting means for writing/erasing data by changing the electrical resistance by applying an electrical power across the variable resistance element; and data readout means for reading out the stored data by detecting an electrical resistance state based on an amount of an electric current passing through the variable resistance element when applying a readout voltage across the variable resistance element.

What is claimed is:

1. A variable resistance element comprising:
   a first electrode;
   a second electrode;
   a metal oxide material sandwiched between the first and second electrodes;
   the variable resistance element having an electrical resistance between the first and second electrodes, the electrical resistance changing reversibly in response to a voltage applied between the first and second electrodes; and a low resistance material inside the metal oxide material, the low resistance material being provided so as to be out of contact with at least either one of the first and second electrodes and having a lower electrical resistance than the metal oxide material, the variable resistance element having a filament provided between the at least either one of the first and second electrodes and the low resistance material, the filament functioning as a conductive path between the first electrode and the second electrode in a case where the electrical resistance is in a low resistance state.

2. A variable resistance element comprising:
a first electrode;
a second electrode;
a metal oxide material sandwiched between the first and second electrodes;
the variable resistance element having an electrical resistance between the first and second electrodes, the electrical resistance changing reversibly in response to a voltage applied between the first and second electrodes; and
a low resistance material inside the metal oxide material, the low resistance material being provided so as to be out of contact with at least either one of the first and second electrodes and having a lower electrical resistance than the metal oxide material,
the low resistance material being made from at least either one of respective elements constituting the first electrode and the second electrode.

3. The variable resistance element according to claim 2, wherein:
the metal oxide material is a polycrystal; and
the low resistance material is formed at a grain boundary of the metal oxide material.

4. A variable resistance element comprising:
a first electrode;
a second electrode;
a metal oxide material sandwiched between the first and second electrodes;
the variable resistance element having an electrical resistance between the first and second electrodes, the electrical resistance changing reversibly in response to a voltage applied between the first and second electrodes; and
a low resistance material inside the metal oxide material, the low resistance material being provided so as to be out of contact with at least either one of the first and second electrodes and having a lower electrical resistance than the metal oxide material,
the metal oxide material being a polycrystal,
the low resistance material being made from at least one type of a metal element constituting the metal oxide material,
the low resistance material being formed at a grain boundary of the metal oxide material.

5. A variable resistance element comprising:
a first electrode;
a second electrode;
a metal oxide material sandwiched between the first and second electrodes;
the variable resistance element having an electrical resistance between the first and second electrodes, the electrical resistance changing reversibly in response to a voltage applied between the first and second electrodes; and
a low resistance material inside the metal oxide material, the low resistance material being provided so as to be out of contact with at least either one of the first and second electrodes and having a lower electrical resistance than the metal oxide material,
the low resistance material being provided by causing an element constituting at least either one of the first and second electrodes to be diffused into the metal oxide material by a heat treatment.

6. A variable resistance element comprising:
a first electrode;
a second electrode;
a metal oxide material sandwiched between the first and second electrodes,
the variable resistance element having an electrical resistance, between the first and second electrodes, changing reversibly in response to a voltage applied between the first and second electrodes;
a first region and a second region between the metal oxide material and at least either one of the first and second electrodes, the first and second regions being provided in this order from the metal oxide material, the first region including oxygen and a first metal element, the second region being adjacent to the first region and including oxygen, the first metal element, and
a second metal element, the first metal element being included in the metal oxide material, and the second metal element constituting at least either one of the first and second electrodes; and
in the first region, a ratio of the number of atoms of the oxygen to that of atoms of the first metal element is higher than the ratio in the metal oxide material.

7. The variable resistance element according to claim 6, wherein the second metal element is aluminium.

8. The variable resistance element according to claim 6, wherein the metal oxide material is made of a nickel oxide.

9. A method for producing a variable resistance element having a first electrode, a second electrode, and a metal oxide material sandwiched between the first and second electrodes, the variable resistance element having an electrical resistance, between the first and second electrodes, changing reversibly in response to a voltage applied between the first and second electrodes, the method comprising:
providing, inside the metal oxide material, a low resistance material having an electrical resistance lower than the metal oxide material and being out of contact with at least either one of the first and second electrodes, by diffusing, into the metal oxide material, an element constituting at least either one of the first and second electrodes.

10. The method according to claim 9, wherein the diffusion in the step of providing the low resistance material is carried out by a heat treatment.

11. A nonvolatile semiconductor storage device comprising:
a memory cell including a variable resistance element, the variable resistance element including:
a first electrode;
a second electrode; and
a metal oxide material sandwiched between the first and second electrodes;
the variable resistance element having an electrical resistance, between the first and second electrodes, changing reversibly in response to a voltage applied between the first and second electrodes; and a low resistance material inside the metal oxide material, the low resistance material being provided out of contact with at least either one of the first and second electrodes and having a lower electrical resistance than the metal oxide material;

the variable resistance element having a filament provided between the at least either one of the first and second electrodes and the low resistance material, the filament functioning as a conductive path between the first electrode and the second electrode in a case where the electrical resistance is in a low resistance state, data writing means for writing externally-inputted data on the memory cell by changing the electrical resistance of the variable resistance element by applying, to the first and second electrodes, a voltage depending on the data; and data readout means for reading out the data stored in the memory cell, based on an amount of an electric current passing through the variable resistance element, the data readout means detecting the amount of the electric current by applying a certain voltage to the first and second electrodes.

12. A variable resistance element comprising:

a first electrode;

a second electrode;

a metal oxide material sandwiched between the first and second electrodes;

the variable resistance element having an electrical resistance between the first and second electrodes, the electrical resistance changing reversibly in response to a voltage applied between the first and second electrodes; and a low resistance material inside the metal oxide material, the low resistance material being provided so as to be out of contact with at least either one of the first and second electrodes and having a lower electrical resistance than the metal oxide material, the low resistance material being formed by reduction of part of the metal oxide material, the reduction being caused in such a manner that an element constituting the at least either one of the first and second electrodes is diffused in the metal oxide material.

13. A variable resistance element comprising:

a first electrode;

a second electrode;

a metal oxide material sandwiched between the first and second electrodes;

the variable resistance element having an electrical resistance between the first and second electrodes, the electrical resistance changing reversibly in response to a voltage applied between the first and second electrodes; and a low resistance material inside the metal oxide material, the low resistance material being provided so as to be out of contact with at least either one of the first and second electrodes and having a lower electrical resistance than the metal oxide material, the metal oxide material being a polycrystal, the low resistance material being provided at a grain boundary of the metal oxide material.

* * * * *